United States Patent
Li et al.

(10) Patent No.: US 8,488,382 B1
(45) Date of Patent: Jul. 16, 2013

(54) ERASE INHIBIT FOR 3D NON-VOLATILE MEMORY

(75) Inventors: Haibo Li, Sunnyvale, CA (US); Xiying Costa, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/332,868

(22) Filed: Dec. 21, 2011

(51) Int. Cl.
    *G11C 11/34* (2006.01)
(52) U.S. Cl.
    USPC .................... 365/185.17; 365/185.24
(58) Field of Classification Search
    USPC .......................... 365/185.17, 185.24
    See application file for complete search history.

(56) References Cited

U.S. PATENT DOCUMENTS

| | | | |
|---|---|---|---|
| 6,987,696 | B1 | 1/2006 | Wang et al. |
| 7,251,161 | B2 | 7/2007 | Yano et al. |
| 7,881,114 | B2 | 2/2011 | Park et al. |
| 7,924,622 | B2 | 4/2011 | Lee et al. |
| 2009/0067253 | A1* | 3/2009 | Li ............................ 365/185.21 |
| 2009/0161432 | A1* | 6/2009 | Kim et al. ................ 365/185.11 |
| 2009/0173989 | A1* | 7/2009 | Yaegashi ..................... 257/320 |
| 2009/0207657 | A1* | 8/2009 | Tamada .................. 365/185.03 |
| 2011/0063914 | A1 | 3/2011 | Mikajiri et al. |
| 2011/0157989 | A1 | 6/2011 | Iwata |
| 2011/0199825 | A1 | 8/2011 | Han et al. |
| 2011/0249503 | A1 | 10/2011 | Yamada et al. |
| 2011/0267888 | A1 | 11/2011 | Dutta et al. |

OTHER PUBLICATIONS

International Search Report & The Written Opinion of the International Searching Authority dated Apr. 4, 2013, International Application No. PCT/US2012/065740.

* cited by examiner

*Primary Examiner* — Michael Tran
(74) *Attorney, Agent, or Firm* — Vierra Magen Marcus LLP

(57) ABSTRACT

An erase process for a 3D stacked memory device performs a two-sided erase of NAND strings until one of more of the NAND strings passes an erase-verify test, then a one-sided erase of the remaining NAND strings is performed. The two-sided erase charges up the body of a NAND string from the source-side and drain-side ends, while the one-sided erase charges up the body of the NAND string from the drain-side end. The NAND strings associated with one bit line form a set. The switch to the one-sided erase can occur when the set meets a set erase-verify condition, such as one, all, or some specified portion of the NAND strings of the set passing the erase-verify test. The erase operation can end when no more than a specified number of NAND strings have not met the erase-verify test. As a result, erase degradation of the memory cells is reduced.

22 Claims, 24 Drawing Sheets

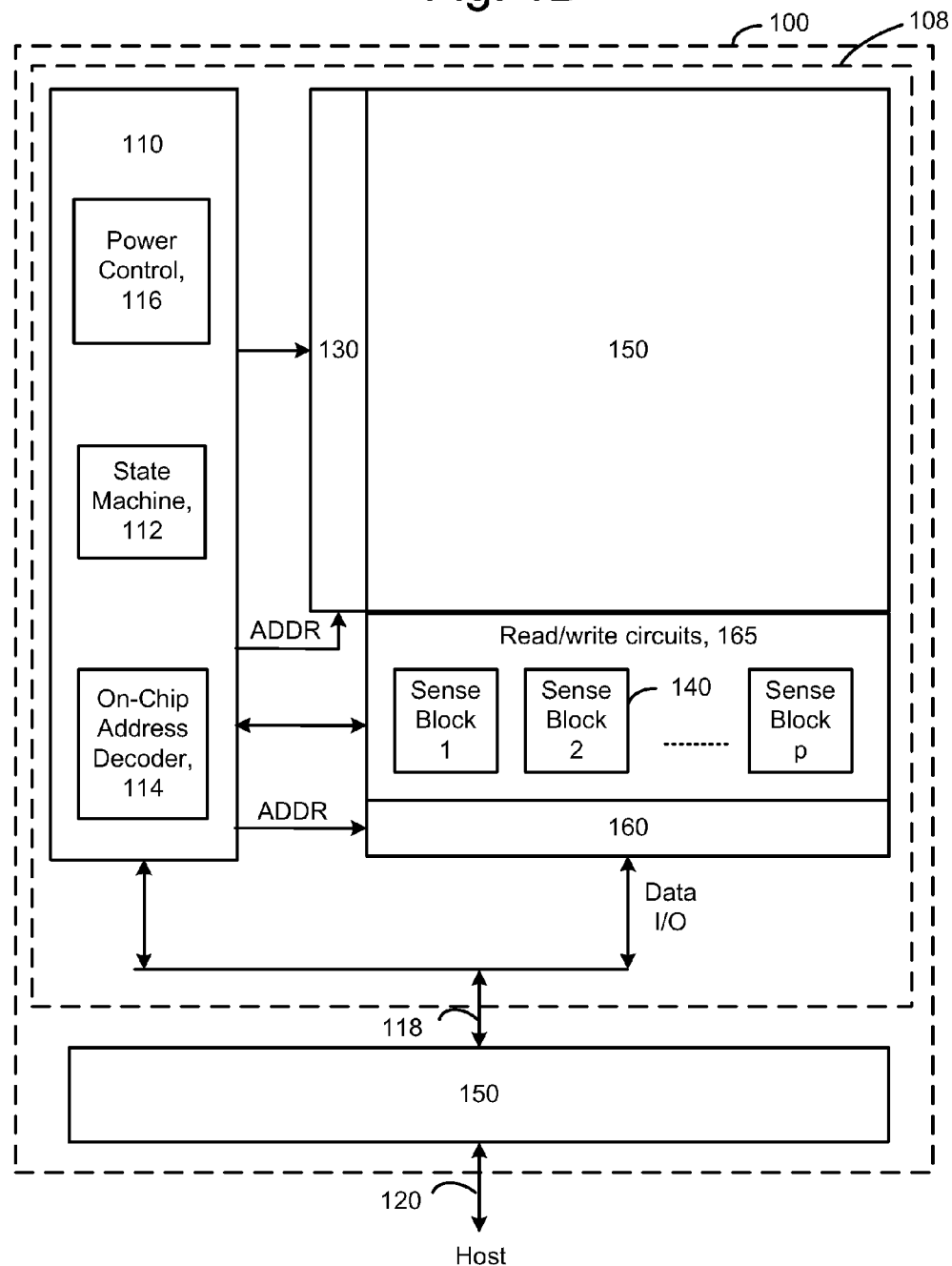

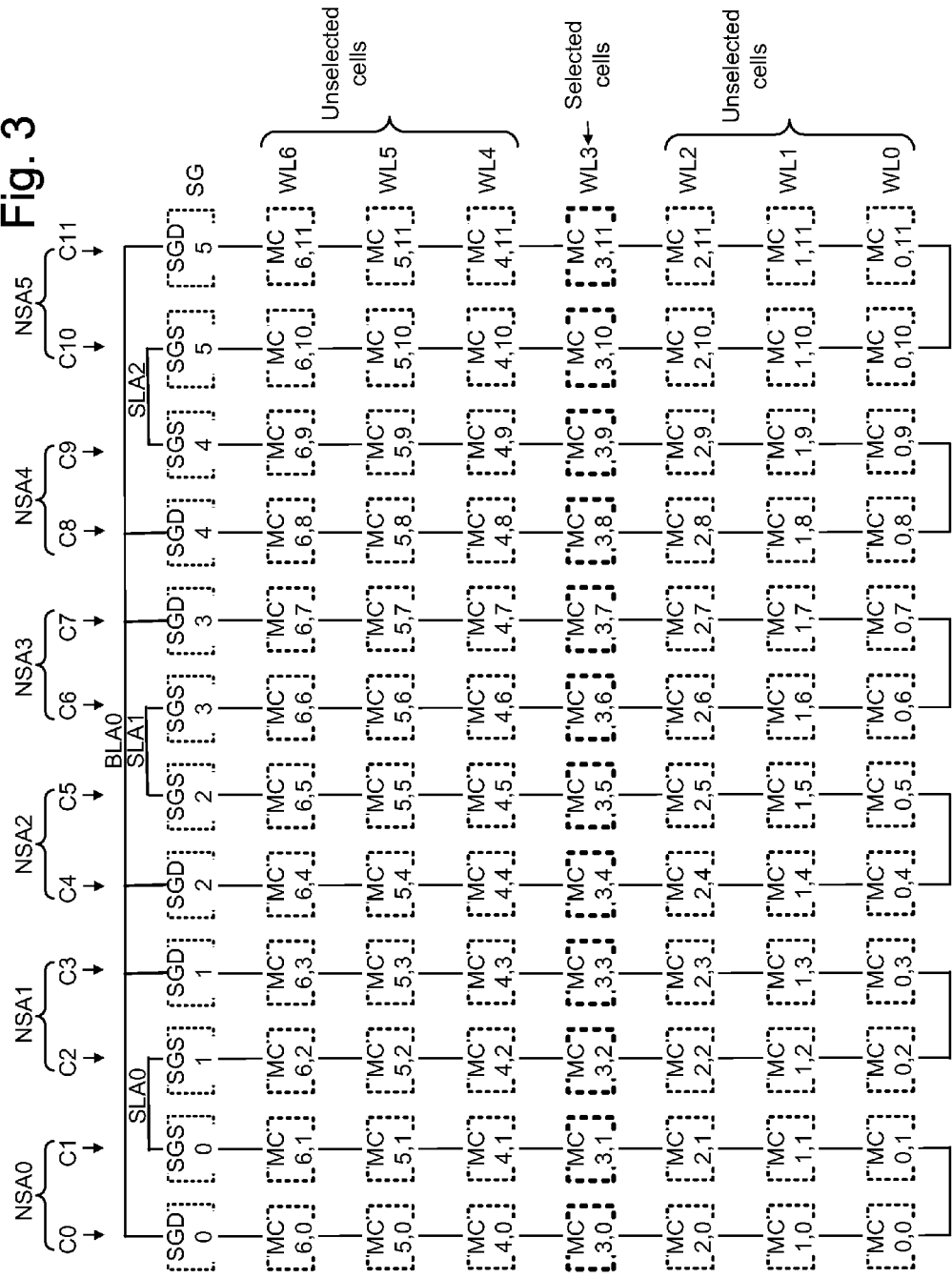

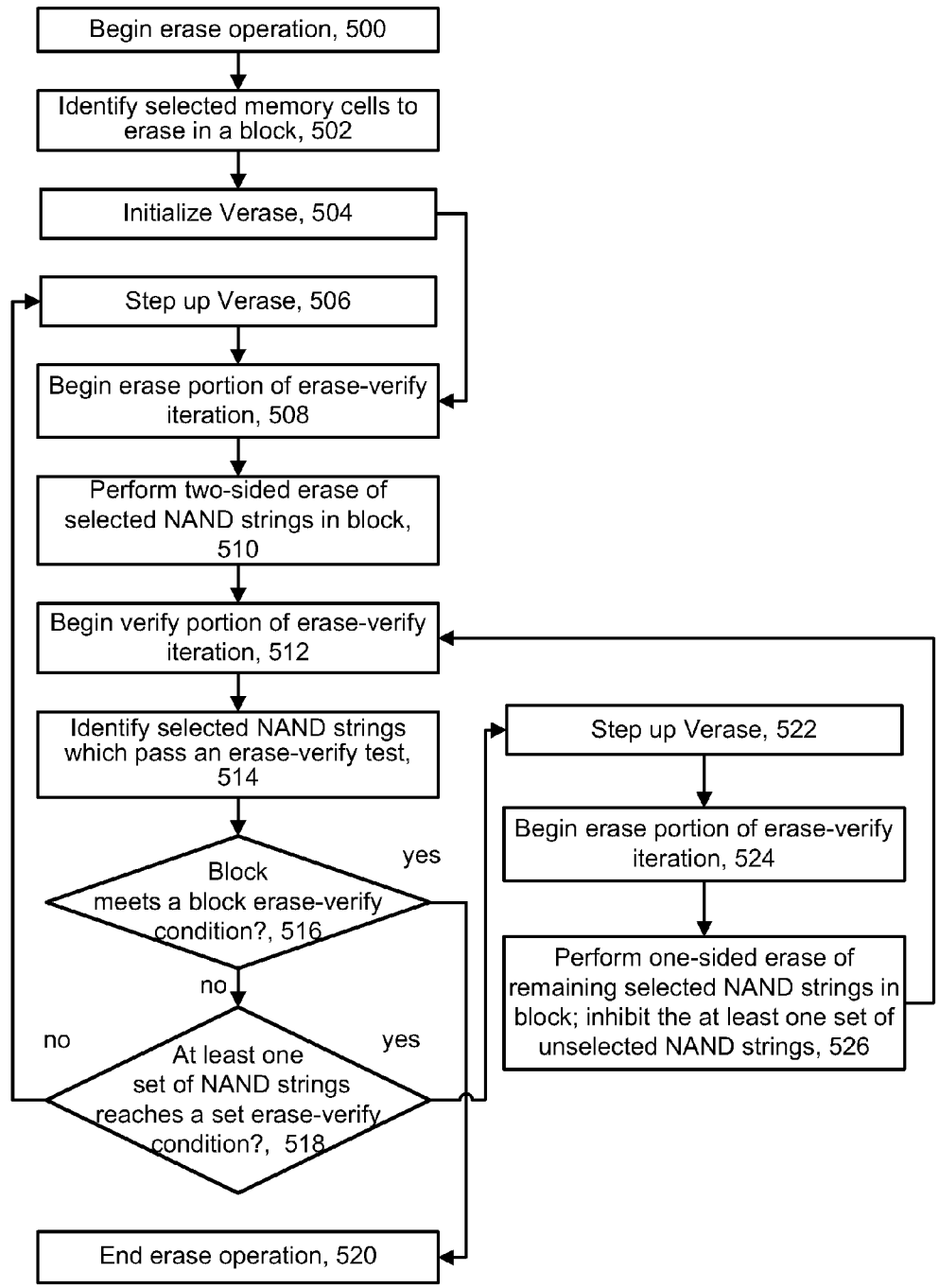

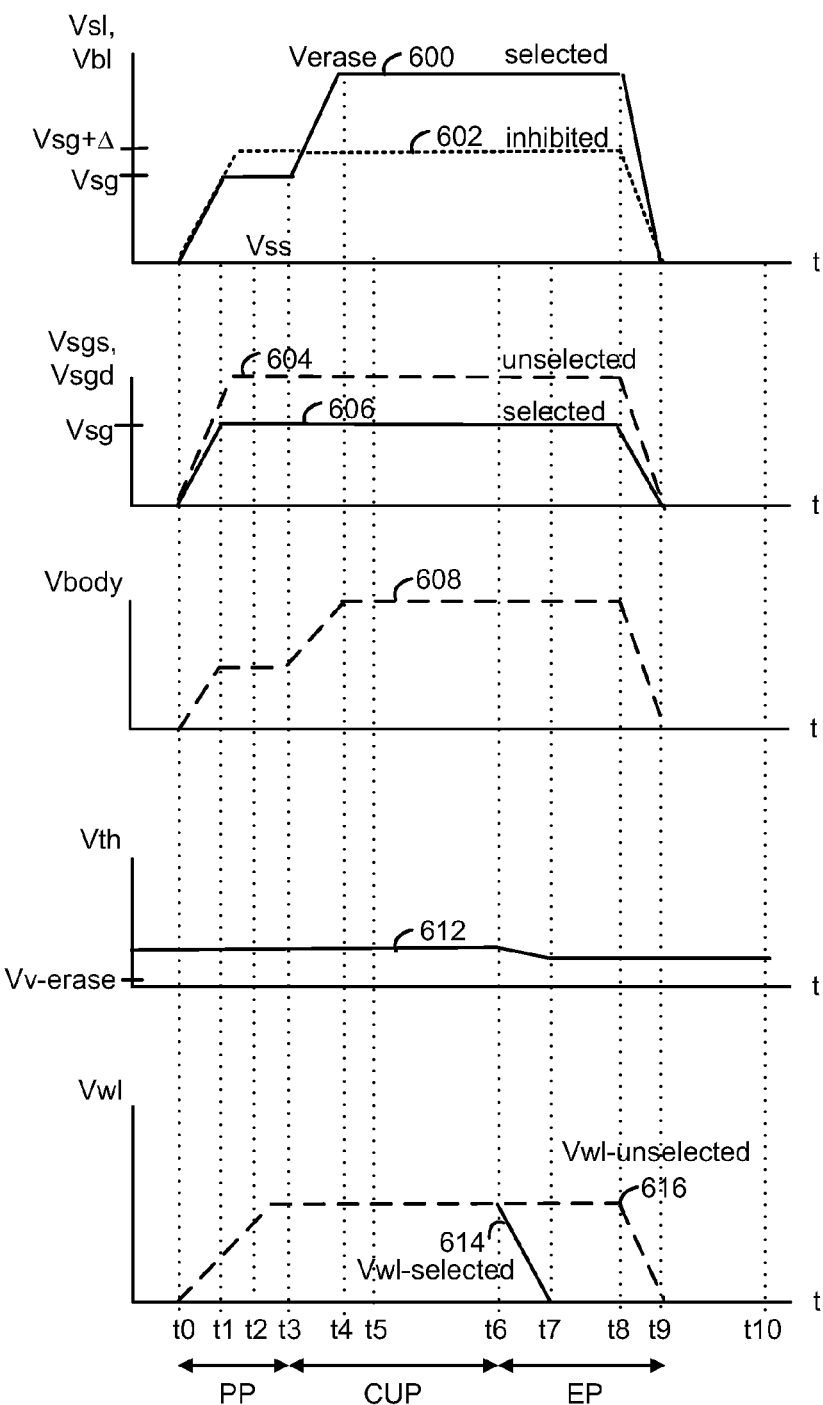

US 8,488,382 B1

ERASE INHIBIT FOR 3D NON-VOLATILE MEMORY

BACKGROUND OF THE INVENTION

1. Field of the Invention

The present invention relates to techniques for erasing memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 1B is a functional block diagram of the 3D stacked non-volatile memory device 100 of FIG. 1A.

FIG. 3 depicts an arrangement of memory cells in an example set of NAND strings such as SetA0 in FIG. 2E.

FIG. 5A depicts one embodiment of an erase operation for a block of memory cells.

FIGS. 6A-6E depict voltages in the erase portion of an erase-verify iteration of an erase operation.

DETAILED DESCRIPTION

A 3D stacked non-volatile memory device can be arranged in multiple blocks, where typically an erase operation is performed one block at a time. An erase operation can include multiple erase-verify iterations which are performed until an erase-verify condition is met for the block, at which point the erase operation ends. One approach is for the erase-verify condition to allow a predetermined number of fail bits. That is, the erase operation can be declared to be successful even if a small number of memory cells have not reached the erase state. However, this approach does not inhibit fast-erasing memory cells from over-erase. As a result, over-erase of some of the memory cells can occur, causing serious degradation of the memory cells as excessive holes are accumulated in the tunneling path.

However, unlike a 2D NAND structure, where a p-well substrate is common for all blocks, 3D stacked non-volatile memory devices have an individual thin poly-silicon body for each NAND string channel, whose bias can be controlled by bit line (BL), source line (SL), drain-side select gate (SGD) and source-side select gate (SGS) voltages. In a normal erase operation, referred to as a two-sided erase, gate-induced drain leakage (GIDL) currents are generated at both the SGD and SGS transistors. The BL and SL are biased at Verase, and SGD and SGS are biased at Vsg. In one approach, once all the memory cells associated with the same bit line pass an erase-verify test (e.g., reach the erase state), the associated bit line voltage is reduced to Vsg+(0~2V), so that no GIDL current is generated at the next erase pulse at the bit line/drain side. Meanwhile, the source line voltage is also reduced to Vsg+(0~2V) so that, for all channels, there will be no GIDL current generated at the source line side for all the following erase pulses of the erase operation. Thus, erase inhibit is achieved for the memory cells which pass the erase-verify test, while those that did not pass are then erased by GIDL current generated at the bit line side only, in a one-sided erase. This avoids over erase of the cells which reach the erase state relatively quickly.

In the discussion below, structural details of 3D stacked non-volatile memory devices are provided generally in FIGS. 1A to 3 and 8A to 9, and details of an erase operation are provided generally in FIGS. 4A to 7C.

Figure 1A:
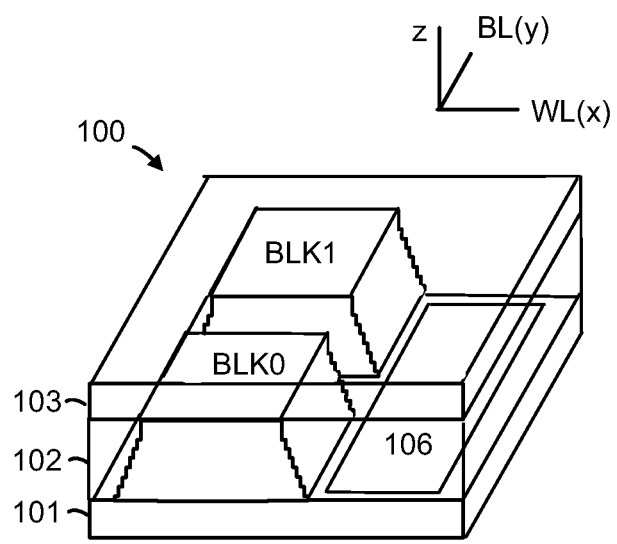
FIG. 1A is a perspective view of a 3D stacked non-volatile memory device.

FIG. 1A is a perspective view of a 3D stacked non-volatile memory device. The memory device 100 includes a substrate 101. On the substrate are example blocks BLK0 and BLK1 of memory cells and a peripheral area 106 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 150, e.g., including the blocks BLK0 and BLK1, control circuitry 110, and read/write circuits 165. The memory array 150 is addressable by word lines via a row decoder 130 and by bit lines via a column decoder 160. The read/write circuits 165 include multiple sense blocks 140 (sensing circuitry) and allow a page of storage elements to be read or programmed in parallel. Typically a controller 150 is included in the same memory device 100 (e.g., a removable storage card) as the one or more memory die 108. Commands and data are transferred between the host and controller 150 via lines 120 and between the controller and the one or more memory die 108 via lines 118.

The control circuitry 110 cooperates with the read/write circuits 165 to perform memory operations on the memory array 150, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 140 can include bit line drivers, in one approach.

In some implementations, some of the components can be combined. In various designs, one or more of the components (alone or in combination), other than memory array 150, can be thought of in as at least one control circuit. For example, at least one control circuit may include any one of, or a combination of, control circuitry 110, state machine 112, decoders 114/160, power control 116, sense blocks 140, read/write circuits 165, and controller 150, and so forth.

In another embodiment, a non-volatile memory system uses dual row/column decoders and read/write circuits. Access to the memory array 150 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 150. In this way, the density of the read/write modules is reduced by one half.

Other types of non-volatile memory in addition to NAND flash memory can also be used.

Figure 1C:
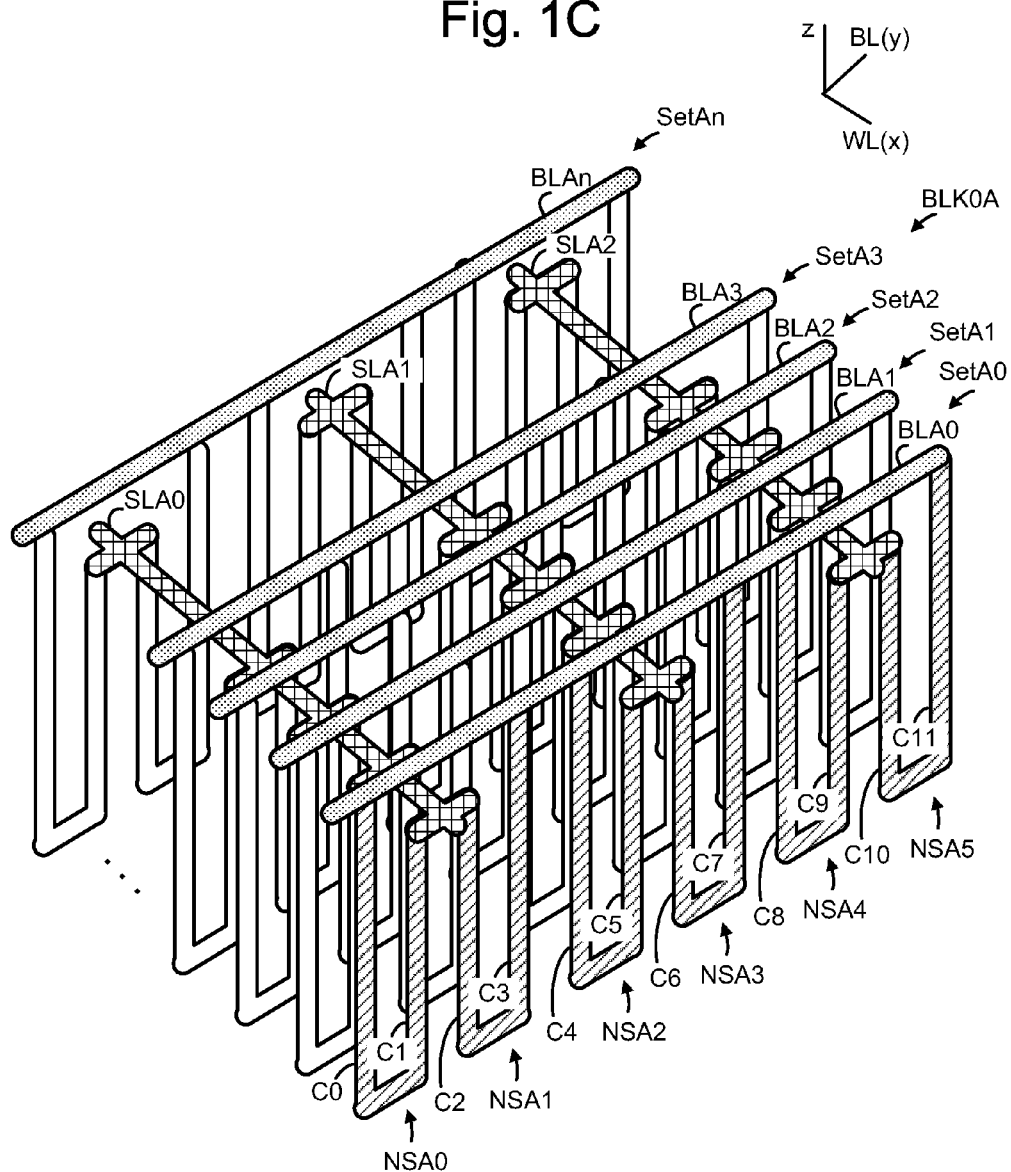
FIG. 1C depicts an embodiment of block BLK0 of FIG. 1A which includes U-shaped NAND strings.

FIG. 1C depicts an embodiment of block BLK0 of FIG. 1A which includes U-shaped NAND strings. The block BLK0A includes U-shaped NAND strings arranged in sets (SetA0, SetA1, SetA2, SetA3, . . . , SetAn, where there are n−1 sets in a block). Each set of NAND strings is associated with one bit line (BLA0, BLA1, BLA2, BLA3, . . . , BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 1D:
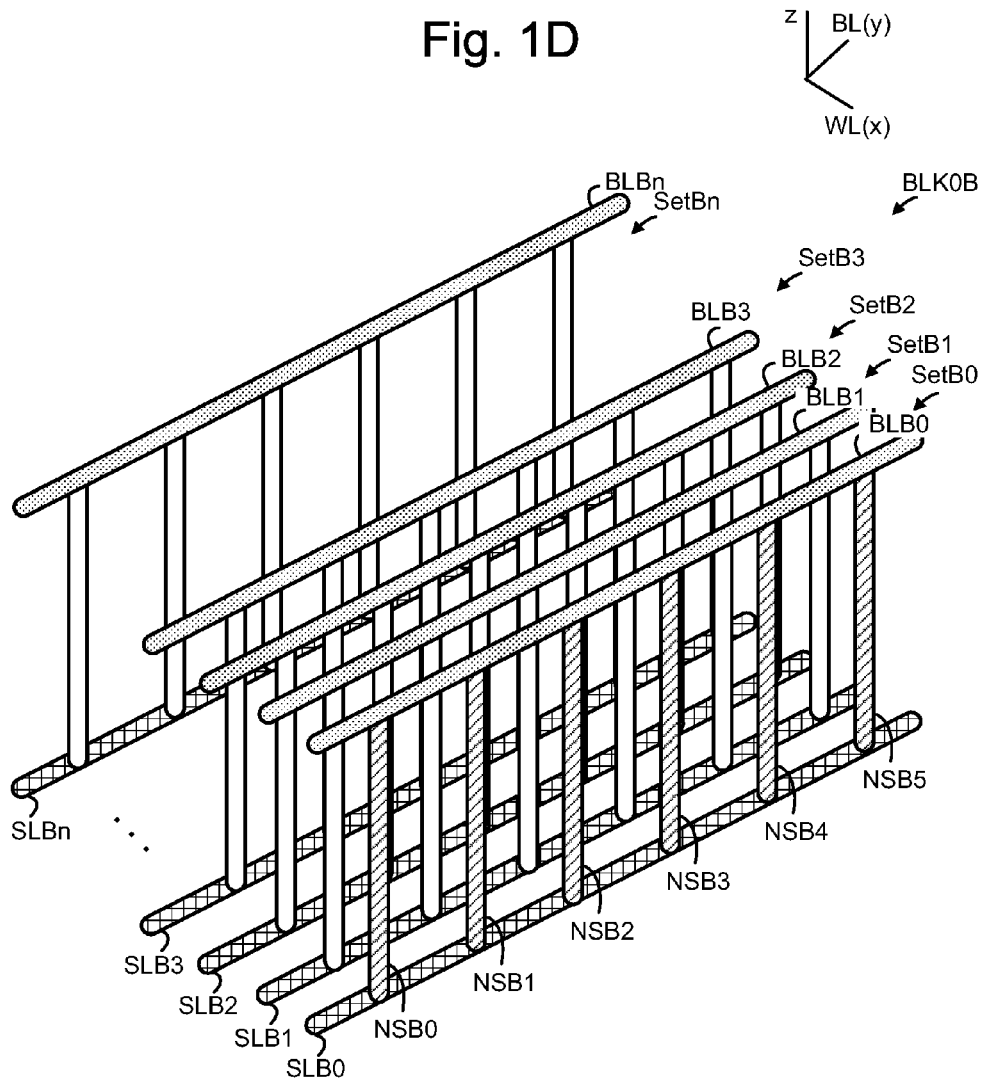
FIG. 1D depicts an embodiment of block BLK0 of FIG. 1A which includes straight NAND strings.

FIG. 1D depicts an embodiment of block BLK0 of FIG. 1A which includes straight NAND strings. The block BLK0B includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, . . . BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 2A:
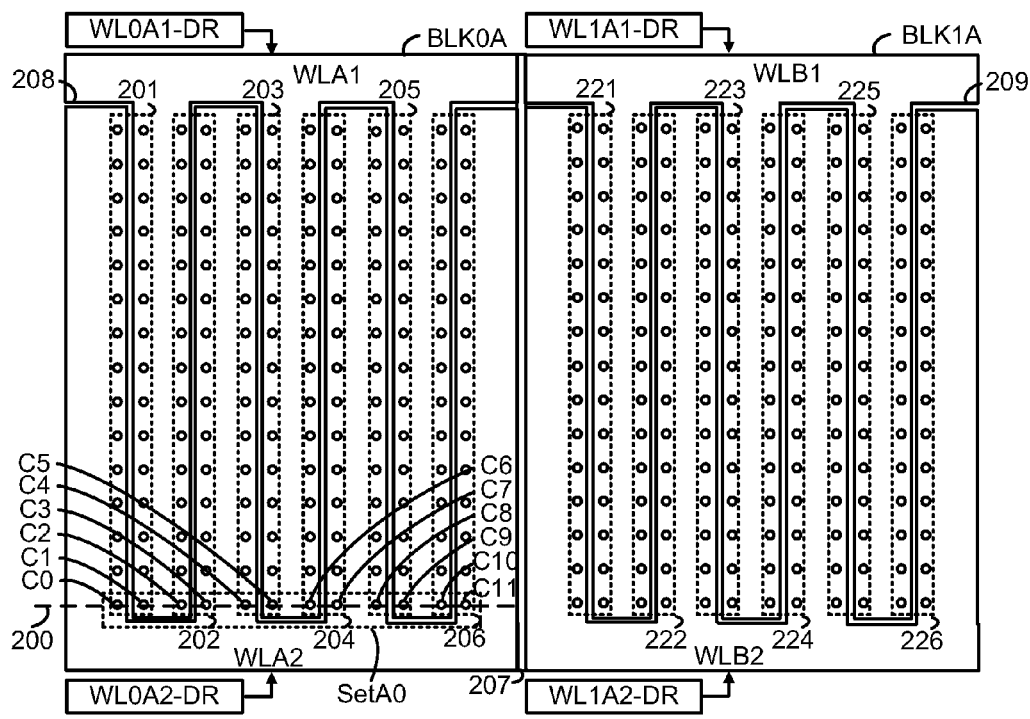
FIG. 2A depicts a top view of a word line layer of a 3D non-volatile memory device having U-shaped NAND strings, consistent with FIG. 1C, showing word line layer portions and associated drivers.

FIG. 2A depicts a top view of a word line layer of a 3D non-volatile memory device having U-shaped NAND strings, consistent with FIG. 1C, showing word line layer portions and associated drivers. This is a representative layer among the multiple word line layers in a stack. Referring also to FIG. 2E, the stack includes alternating dielectric and conductive layers. The dielectric layers include D0 to D8 and may be made of SiO2, for instance. The conductive layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. The word line layer of FIG. 2A may represent any one of WL0 to WL6, for instance. The conductive layers may include doped polysilicon or metal silicide, for instance. An example voltage of 5-10 V may be applied to the back gate to maintain a conductive state which connects the drain- and source-side columns.

FIG. 2A depicts the block BLK0A of FIG. 1C and a similar block BLK1A as an example. For each block, the word line layer is divided into two word line layer portions, e.g., word line layer portions WLA1 and WLA2 in BLK0A, and word line layer portions WLB1 and WLB2 in BLK1A. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 208 of BLK0A is a single continuous slit which extends in a zig-zag pattern in the block so that the block is divided into two portions, WLA1 and WLA2, which are insulated from one another. Similarly, a slit 209 of BLK1A divides BLK1A into two portions, WLB1 and WLB2, which are insulated from one another. This approach can provide greater flexibility in controlling the memory cells since the word line layer portions can be drive independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells in BLK0A along a line 200 include C0 to C11. The figure represents a simplification, as many more rows of memory holes will typically be used, extending to the right and left in the figure. Also, the figures are not necessarily to scale. The columns of memory cells can be arranged in sub-blocks 201 to 206 in BLK0A and 221 to 226 in BLK1A. When U-shaped NAND strings are used, each sub-block can include two adjacent rows of columns of memory cells. In a sub-block, the adjacent rows are separated by the slit. The columns of memory cells on one side of the slit are drain-side columns (e.g., C0, C3, C4, C7, C8 and C11 in FIG. 2E), and the columns of memory cells on the other side of the slit are source-side columns (e.g., C1, C2, C5, C6, C9 and C10 in FIG. 2E). Note that the pattern of two source-side columns between two drain-side columns repeats in the y-direction.

Word line drivers WL0A1-DR, WL0A2-DR, WL1A1-DR and WL1A2-DR independently provide signals such as voltage waveforms to the word line layer portions WLA1, WLA2, WLB1 and WLB2, respectively.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, this is 192K NAND strings. With straight NAND strings, this is 384 k NAND strings.

Figure 2B:
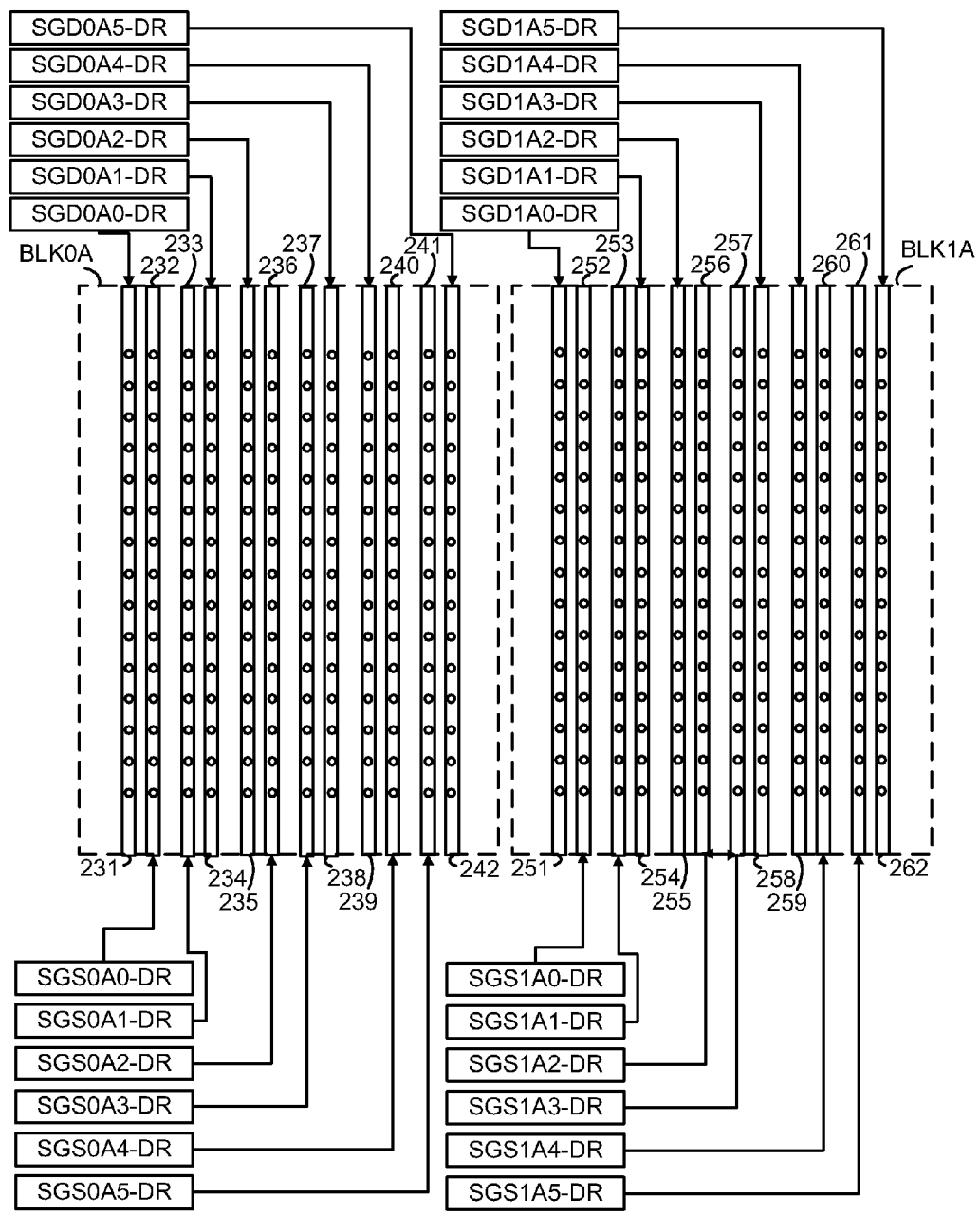
FIG. 2B depicts a top view of a select gate layer of the 3D non-volatile memory device of FIG. 2A, showing drain-side select gate lines, source-side select gate lines and associated drivers.

FIG. 2B depicts a top view of a select gate layer of the 3D non-volatile memory device of FIG. 2A, showing drain-side select gate lines, source-side select gate lines and associated drivers. For example, this can represent layer SG of FIG. 2E. A separate select gate line, e.g., a conductive line or path, is associated with each row of columns of memory cells. Moreover, separate select gate lines can be connected to the drain- and source-side columns of a U-shaped NAND string. For example, BLK0A includes drain-side select gate lines 231, 234, 235, 238, 239 and 242, which are driven by select gate drivers SGD0A0-DR to SGD0A5-DR, respectively, and source-side select gate lines 232, 233, 236, 237, 240 and 241, which are driven by select gate drivers SGS0A0-DR to SGS0A5-DR, respectively (DR denotes driver). Similarly, BLK1 includes drain-side select gate lines 251, 254, 255, 258, 259 and 262, which are driven by select gate drivers SGD6-DR to SGD11-DR, respectively, and source-side select gate lines 252, 253, 256, 257, 260 and 261, which are driven by select gate drivers SGS0A1-DR to SGS1A5-DR, respectively. The select gate drivers provide signals such as voltage waveforms to the select gate lines.

Figure 2C:
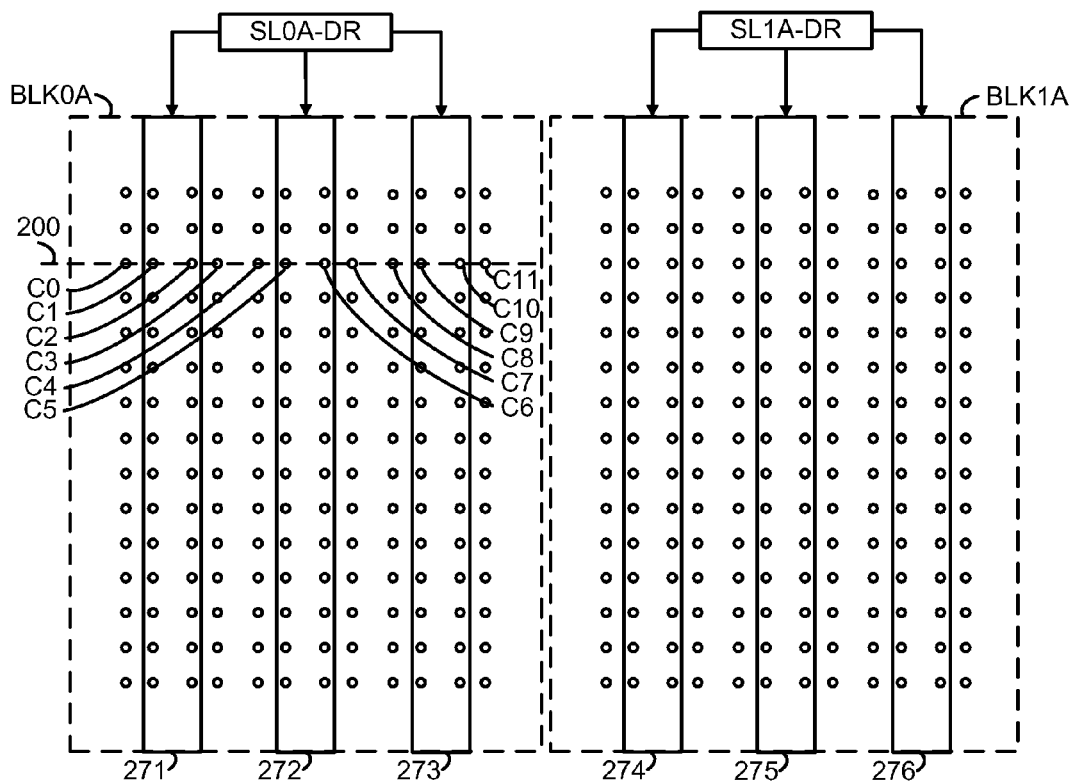
FIG. 2C depicts a top view of a source line layer of the 3D non-volatile memory device of FIG. 2A, showing source lines and associated drivers.

FIG. 2C depicts a top view of a source line layer of the 3D non-volatile memory device of FIG. 2A, showing source lines and associated drivers. For example, this can represent layer SL of FIG. 2E. A source line, e.g., a conductive line or path, is associated with pairs of rows of source-side columns of memory cells. A source line is connected to a source-side end of a U-shaped or straight NAND string. For example, BLK0A includes source lines 271 (e.g., connected to C0 and C1), 272 (e.g., connected to C5 and C6) and 273 (e.g., connected to C9 and C10). Similarly, BLK1A includes source lines 274, 275 and 276. The source line drivers provide signals such as voltage waveforms to the source lines. For example, SL0A-DR provides signals to source lines 271 to 273, and SL1A-DR provides signals to source lines 274 to 276.

Figure 2D:
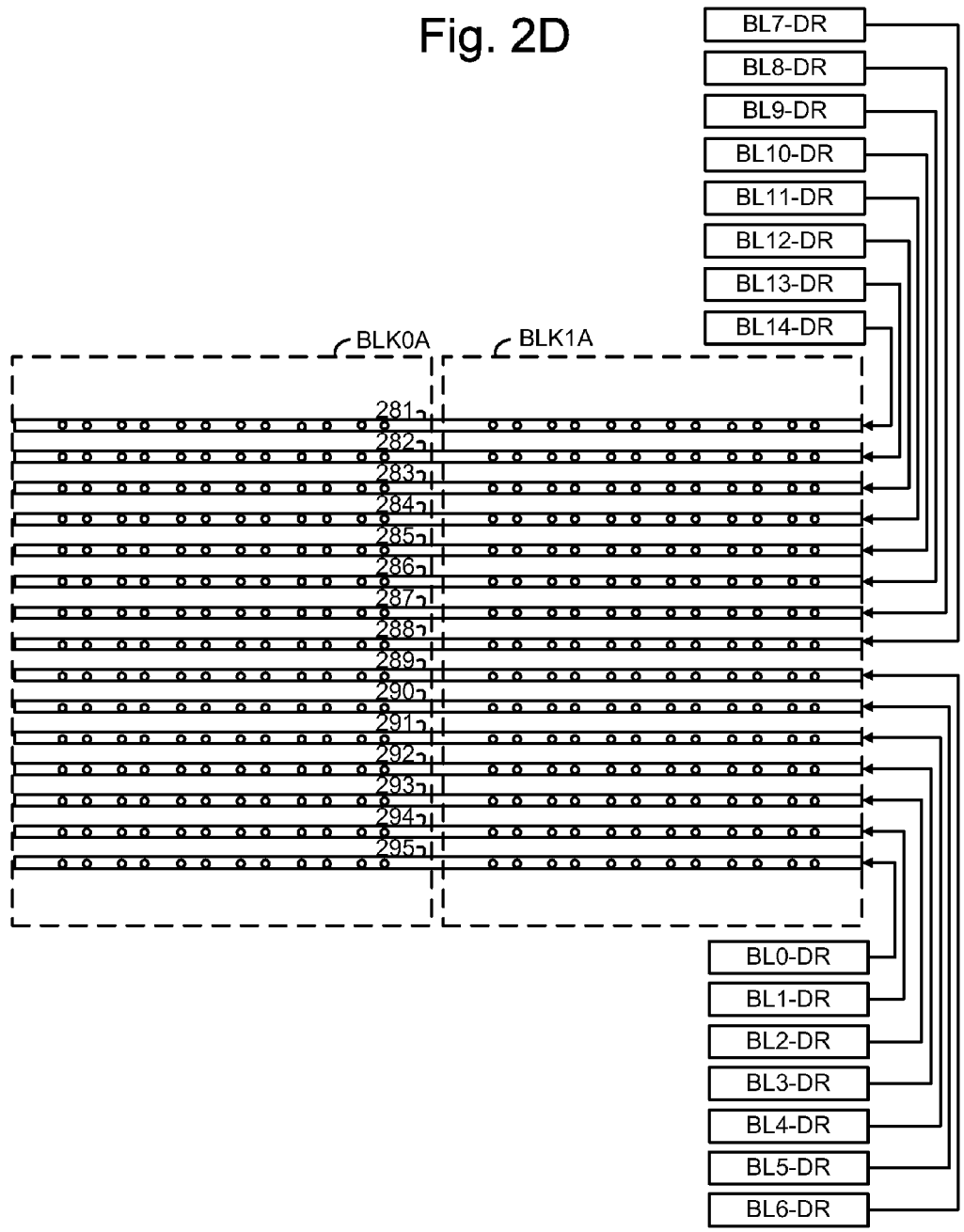
FIG. 2D depicts a top view of a bit line layer of the 3D non-volatile memory device of FIG. 2A, showing bit lines and associated drivers.
Figure 2E:
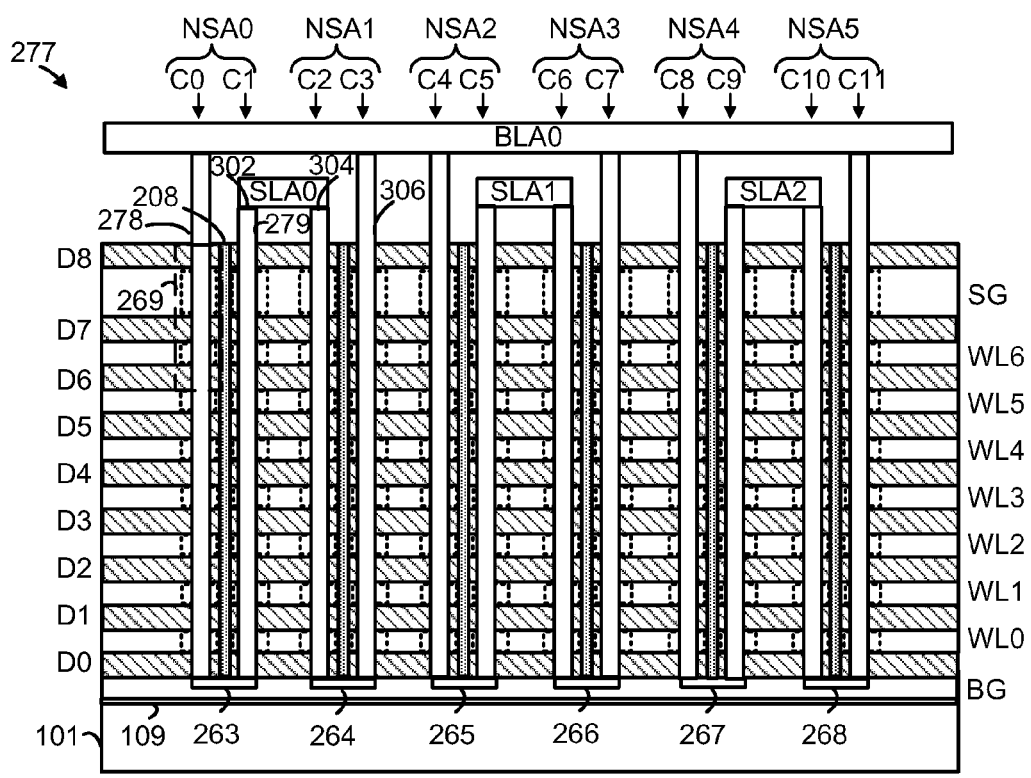
FIG. 2E depicts a cross-sectional view of a block of the 3D non-volatile memory device of FIG. 2A, along line 200 of SetA0 of NAND strings of FIG. 2A.

FIG. 2D depicts a top view of a bit line layer of the 3D non-volatile memory device of FIG. 2A, showing bit lines and associated drivers. For example, this can represent layer BL of FIG. 2E. A bit line, e.g., a conductive line or path, is associated with a set of columns of memory cells which extend in a horizontal line in the figure. A bit line extends across multiple blocks which are adjacent laterally of one another. A bit line is connected to a drain-side end of a U-shaped or straight NAND string, e.g., to a vertical channel or body of the NAND string. For example, bit lines 281 to 295 are driven by bit line drivers BL0-DR to BL14-DR, respectively. The bit line drivers provide signals such as voltage waveforms to the ends of the NAND strings. Each bit line can be independently driven.

FIG. 2E depicts a cross-sectional view of a block of the 3D non-volatile memory device of FIG. 2A, along line 200 of SetA0 of NAND strings of FIG. 2A. Columns of memory cells C0 to C11 are depicted in the multi-layer stack. The stack 277 includes the substrate 101, an insulating film 109 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 268 which connect the columns. The back gate thus connects the two columns of each U-shaped NAND string. For example, NSA0 includes columns C0 and C1 and connecting portion 263. NSA0 has a drain end 278 and a source end 302. NSA1 includes columns C2 and C3 and connecting portion 264. NSA1 has a drain end 306 and a source end 304. NSA2 includes columns C4 and C5 and connecting portion 265. NSA3 includes columns C6 and C7 and connecting portion 266. NSA4 includes columns C8 and C9 and connecting portion 267. NSA5 includes columns C10 and C11 and connecting portion 268.

The source line SLA0 is connected to the source ends 302 and 304 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 277 extend behind the U-shaped NAND strings depicted in the cross-section, e.g., along the x-axis. The U-shaped NAND strings NSA0 to NSA5 are each in a different sub-block, but are in a common set of NAND strings (SetA0).

The slit portion 208 from FIG. 2A is also depicted as an example. In the cross-section, multiple slit portions are seen, where each slit portion is between the drain- and source-side columns of a U-shaped NAND string. Portions of the source lines 271 to 273 are also depicted. A portion of the bit line BLA0 is also depicted.

Short dashed lines depict memory cells and select gates, as discussed further below.

Figure 2F:
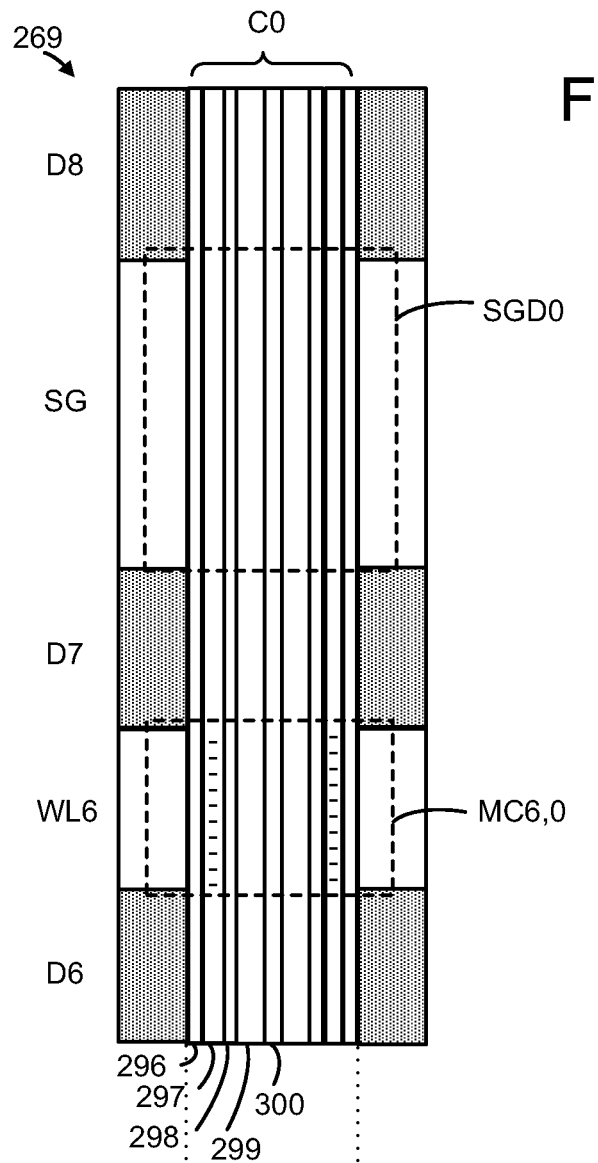
FIG. 2F depicts a close-up view of the region 269 of the column C0 of FIG. 2E, showing a drain-side select gate SGD0 and a memory cell MC6,0.

A region 269 of the stack is shown in greater detail in FIG. 2F.

FIG. 2F depicts a close-up view of the region 269 of the column C0 of FIG. 2E, showing a drain-side select gate SGD0 and a memory cell MC6,0. See also FIG. 3, where this notation is also used. The region shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns.

Figure 4A:
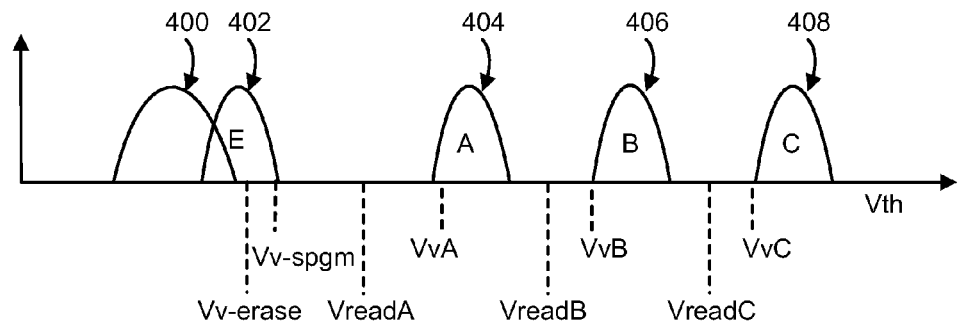
FIG. 4A depicts threshold voltage distributions of an erased state and higher data states.

When a memory cell is programmed, electrons are stored in a portion of the charge trapping layer which is associated with the memory cell. For example, electrons are represented by "-" symbols in the charge trapping layer 297 for MC6,0. These electrons are drawn into the charge trapping layer from the polysilicon body, and through the tunnel oxide. The threshold voltage of a memory cell is increased in proportion to the amount of stored charge. During an erase operation, a voltage in the polysilicon body is raised due to GIDL, as mentioned, while a voltage of one or more selected word line layers floats. The voltage of the one or more selected word line layers is then driven down sharply to a low level such as 0 V to create an electric field across the tunnel oxide which causes holes to be injected from the memory cell's body to the charge trapping layer, resulting in a large Vth downshift toward an erase-verify level, Vv-erase (FIG. 4A). This process can be repeated in successive iterations until an erase-verify condition is met, as discussed further in connection with FIGS. 4B to 5C.

For unselected word lines, the word lines are floated but not driven down to a low level so that the electric field across the tunnel oxide is relatively small, and no, or very little, hole tunneling will occur. Memory cells of the unselected word lines will experience little or no Vth downshift, and as a result, they will not be erased.

Figure 2G:
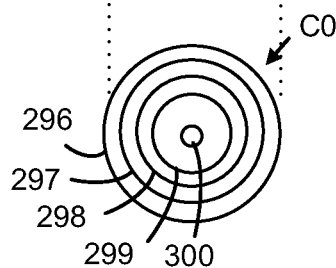
FIG. 2G depicts a cross-sectional view of the column C0 of FIG. 2F.

FIG. 2G depicts a cross-sectional view of the column C0 of FIG. 2F. Each layer is ring-shaped in one possible approach, except the core filler which is cylindrical.

FIG. 3 depicts an arrangement of memory cells in an example set of NAND strings such as SetA0 in FIG. 2E. NAND strings NSA0 to NSA5 and their columns of memory cells are depicted. For convenience, a notation is used in which SGD denotes a drain-side select gate of a NAND string, e.g., the select gate at the top of the drain-side column of a U-shaped NAND string. Each SGD is numbered, starting from 0 and proceeding left to right across the figures, e.g., from SGD0 to SGD5. SGS denotes a source-side select gate of a NAND string, e.g., the select gate at the top of the source-side column of a U-shaped NAND string. Each SGS is also numbered, starting from 0 and proceeding left to right across the figures, e.g., from SGS0 to SGS5.

Each memory cell is numbered in a (z,y) format where z denotes a word line layer of the memory cell and y denotes the position of the memory cell in the word line layer. For example, memory cells connected to WL0, WL1, WL2, WL3, WL4, WL5 and WL6 are numbered as MC0,0 to MC0,11, MC1,0 to MC1,11, MC2,0 to MC2,11, MC3,0 to MC3,11, MC4,0 to MC4,11, MC5,0 to MC5,11, and MC6,0 to MC6,11, respectively, proceeding left to right across the figures. WL0, WL1, WL2, WL3, WL4, WL5 and WL6 denote word line layer portions at a given level or height in the stack.

Additionally, a heavy dashed line border of a memory cell indicates a selected memory cell which has been selected in an erase operation. A lighter dashed line border of a memory cell indicates an unselected memory cell which has not been selected in an erase operation, such as a non-erased memory cell which is eligible to store user data, or a dummy memory cell which is not eligible to store user data. A dummy memory cell can be programmed to any data state, for instance, and is not considered to be eligible to store useful information such as user data or system data. Dummy memory cells can be set aside by the control circuitry and not used to store user data.

Recall that each word line layer can have two, inter-digitated word line layer portions as set forth in FIG. 2A. In one approach, only the memory cells of one of the word line layer portions are selected to be erased. In another approach, as shown here, the memory cells of both of the word line layer portions in a block are selected to be erased. For example, all of the memory cells associated with WL3, namely MC3,0 to MC3,11, are selected to be erased in an erase operation. The memory cells of WL0 to WL2 and WL4 to WL6 are unselected memory cells which are not selected to be erased in the erase operation. Generally, an erase operation can involve one or more word line layers, one or more word line layer portions in a word line layer, and all, or fewer than all, memory cells in a selected word line layer or portion. In the simplest case, all memory cells in a block are selected to be erased.

FIG. 4A depicts threshold voltage distributions of an erased state and higher data states. As mentioned, memory cells can be programmed so that their threshold voltages are in respective ranges which represent data states. Initially, an erase operation is performed which places all of the memory cells in the erased state (E). Subsequently, some of the memory cells can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial erased state 400, a soft programmed erased state (E) 402, an A state 404, a B state 406 and a C state 408. Memory devices with additional data states, e.g., eight or sixteen data states, can also be used. The distribution 400 is realized after the erase operation when storage elements are typically over-erased, past the erase state 402. In the erase operation, one or more erase pulses are applied to the NAND string at its source and/or drain ends, until the threshold voltage of the storage elements being erased transitions below an erase-verify level, Vv-erase which can be 0 V or close to 0V, in one approach. Once the erase operation is completed for a block, the soft programming operation is performed, in which one or more positive voltage pulses are applied to the control gates of the storage elements, such as via a word line, to increase the threshold voltages of some or all of the storage elements in the distribution 400 closer to and below a soft programming (SPGM) verify level, Vv-spgm, to the erased state 402. For example, a certain, small fraction of the storage elements may be soft programmed to have a Vth above Vv-spgm, at which point the soft programing ends, leaving most of the other storage elements with a Vth which is close to, but below, Vv-spgm. Vv-spgm is typically above or equal to Vv-erase. The soft programming operation advantageously results in a narrow erase state distribution 402. Once the soft programming operation is complete, programming to higher data states can occur, such as to states A, B and C using verify levels VvA, VvB and VvC, respectively. A subsequent read operation can use the levels VreadA, VreadB and VreadC.

A set erase-verify condition can be met based on whether one or more memory cells have a Vth below Vv-erase, e.g., as discussed in connection with FIG. 5A.

Figure 4B:
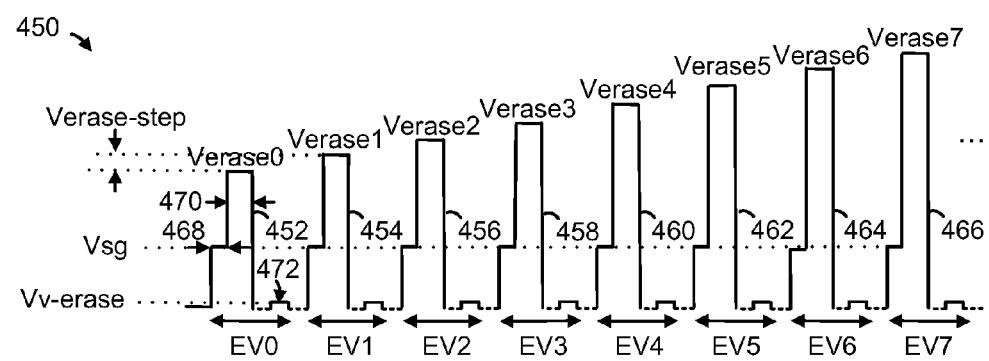
FIG. 4B depicts a series of erase pulses and verify pulses in an erase operation.

FIG. 4B depicts a series 450 of erase pulses (Verase0 to Verase7) and verify pulses (see, e.g., example erase-verify pulse 472) in an erase operation. The erase pulses and verify pulses are presented together for understanding although they are applied to different portions of the memory device. An erase operation can include multiple erase-verify iterations, e.g., EV0 to EV7. Each erase-verify iteration can include an erase portion followed by a verify portion. Examples erase portions 452, 454, 456, 458, 460, 462, 464 and 466 are provided for erase-verify iterations EV0, EV1, EV2, EV3, EV4, EV5, EV6 to EV7. Example verify portion 472 having an amplitude of Vv-erase follows erase portion 452. In the erase portion, an erase pulse or voltage is applied to one or both ends of a NAND string. Each erase portion can have a first portion which is applied in a preparation phase, and a second portion which is applied in charge up and erase phases, as discussed further below. For example, erase portion 452 has a first portion 468 and a second portion 470. In this example, the first portion of each erase portion has an amplitude of Vsg (an initial lower level), and the second portions of the erase portions have amplitudes (subsequent peak levels) of Verase0, Verase1, Verase2, Verase3, Verase4, Verase5, Verase6 and Verase7, which increase according to a step size of Verase-step.

The erase pulses can thus step up in amplitude in each iteration, in one approach. In the verify portion, a determination is made as to whether the Vth of a selected memory cell which is to be erased has fallen below Vv-erase. This can include determining whether the selected memory cell is in a conductive state when a word line voltage of Vv-erase is applied to the selected memory cell. If the selected memory cell is in a conductive state, Vth<Vv-erase and the selected memory cell has been erased. If the selected memory cell is in a non-conductive state, Vth>Vv-erase and the selected memory cell has not yet been erased.

FIG. 5A depicts one embodiment of an erase operation for a block of memory cells. An erase operation begins at step 500. Step 502 identifies selected memory cells to be erased in a block. For example, an entire block can be erased, or memory cells associated with one or more word line layers can be selected to be erased. All, or fewer than all, memory cells in a word line layer or layer portion can be selected to be erased. The identifying steps can be performed by control circuitry, and can involve a determination of one or more selected blocks, memory cells, NAND strings and/or sets of NAND strings. One or more unselected blocks, memory cells, NAND strings and/or sets of NAND strings can similarly be identified by the control circuitry. An erase operation can be initiated by control circuitry of the memory device independently of an external host controller, or in response to an external host controller, for instance. A NAND string which contains a selected memory cell is a selected NAND string.

Step 504 initializes the value of Verase. Step 508 begins an erase portion of an erase-verify iteration. At step 510, the erase portion includes performing a two-sided erase of all selected NAND strings in a block, in one approach. For example, these can be NAND strings in SetA0 to SetAn in FIG. 1C, or in SetB0 to SetBn in FIG. 1D. See FIGS. 5B and 6A to 6E for further details. Generally, an erase operation can involve an entire block, or one or more sub-blocks. Step 512 begins the verify portion of the erase-verify iteration. At step 514, the verify portion identifies any (one or more) of the selected NAND strings which pass an erase-verify test. A selected NAND string passes the erase-verify test when sensing circuitry determines that the string is conductive, when Vv-erase is applied to the control gates of the selected memory cells of the string. A selected NAND string which passes the erase-verify test is now considered to be an unselected or inhibited NAND string.

Decision step 516 determines if the block meets a block erase-verify condition. In one approach, the block erase-verify condition is met when no more than an integer number or fraction N of the selected NAND strings have not passed the erase-verify test. For example, with 192 k selected NAND strings in a block, it is possible to end the erase operation before all NAND strings have passed the erase-verify test. For instance, N can be about 1-10% of the number of NAND strings in a block (e.g., 1-10% of 192 k). The higher N is set, the sooner the erase operation can be completed, so that the highest amplitude value of Verase which is used is reduced, compared to the case where N=0. Even though some NAND strings have not passed the erase-verify test when the erase operation ends, the associated selected memory cells are likely very close to passing the test, and can be successfully soft-programmed.

If decision step 516 is true, the erase operation ends at step 520. If decision step 516 is false, decision step 518 determines whether at least one set of NAND strings reaches a set erase-verify condition. The set erase-verify condition may be met when at least one selected NAND string in the set has passed the erase-verify test, for instance. In another approach, the set erase-verify condition may be met when at least an integer number or fraction M1 of the selected NAND strings in the set have passed the erase-verify test, or when no more than an integer number or fraction M2 of the selected NAND strings in the set have not passed the erase-verify test. If decision step 518 is false, Verase is stepped up at step 506 for the next erase-verify iteration, which is again a two-sided erase. If decision step 518 is true, Verase is stepped up at step 522 for the next erase-verify iteration, which is the first one-sided erase. Decision step 518 may not be true until after several erase-verify iterations have been performed. Step 524 begins the erase portion of the next erase-verify iteration. Step 526 performs a one-sided erase of the remaining selected NAND strings. The step also includes inhibiting the at least one set of unselected NAND strings. See FIGS. 5C and 6A to 6E for further details. Step 512 begins the verify portion of the erase-verify iteration. The remainder of the erase operation will use a one-sided erase.

In this case, a two-sided erase is performed initially until one (or more) sets reach the set erase-verify condition, after which only one-sided erases occur. This allows each set of NAND strings to be inhibited to avoid over-erase once the set meets the set erase-verify condition, while allowing erasing to continue for the remaining sets which have not yet met the set erase-verify condition. As the erase-verify iterations occur, the sets will be become inhibited in turn until the erase operation is completed.

Figure 5B:
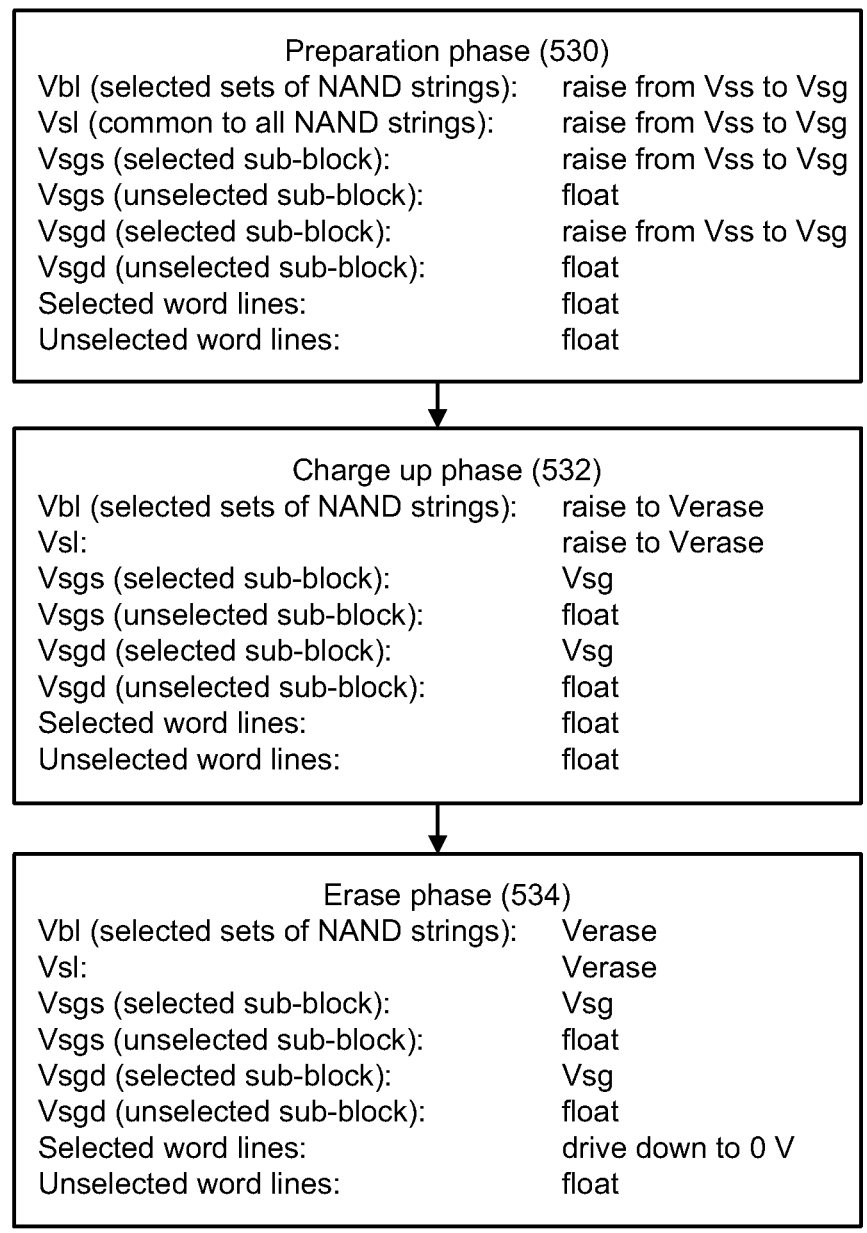
FIG. 5B depicts details of step 510 (two-sided erase) of FIG. 5A.

FIG. 5B depicts details of step 510 (two-sided erase) of FIG. 5A. Step 506 provides the erase portion in a two-sided erase of all sets of NAND strings in a block. An erase operation can include three phases, discussed further in connection with FIGS. 6A to 6E: a preparation phase (step 530), a charge up phase (step 532) and an erase phase (step 534). The preparation phase (PP) corresponds to the time interval t0-t3 in FIGS. 6A to 6E. At step 530, the preparation phase sets voltages as follows: Vbl (selected sets of NAND strings): raise from Vss to Vsg (waveform 600); Vsl (common to all NAND strings in a block): raise from Vss to Vsg (waveform 600); Vsgs (selected sub-block): raise from Vss to Vsg (waveform 606); Vsgs (unselected sub-block): float (waveform 604); Vsgd (selected sub-block): raise from Vss to Vsg (waveform 606); Vsgd (unselected sub-block): float (waveform 604); Selected word lines: float (waveform 614); and unselected word lines: float (waveform 616). If all NAND strings in the block are selected to be erased, there will be no inhibited NAND strings during the two-sided erase.

A selected sub-block is a sub-block with one or more selected NAND strings, and an unselected sub-block is a sub-block with all unselected NAND strings.

A long-dash line represents a floating voltage in FIGS. 6A-6C and 6E, while a solid or short-dash line represents a driven voltage.

The charge up phase (CUP) corresponds to the time interval t3-t6 in FIGS. 6A to 6E. At step 532, the charge up phase sets voltages as follows: Vbl (selected sets of NAND strings): raise to Verase (waveform 600); Vsl: raise to Verase (waveform 600); Vsgs (selected sub-block): Vsg (waveform 606); Vsgs (unselected sub-block): float (waveform 604); Vsgd (selected sub-block): Vsg (waveform 606); Vsgd (unselected sub-block): float (waveform 604); Selected word lines: float (waveform 614); and unselected word lines: float (waveform 616).

The erase phase (EP) corresponds to the time interval t6-t9 in FIGS. 6A to 6E. At step 534, the erase phase sets voltages as follows: Vbl (selected sets of NAND strings): Verase (waveform 600); Vsl: Verase (waveform 600); Vsgs (selected sub-block): Vsg (waveform 606); Vsgs (unselected sub-block): float (waveform 604); Vsgd (selected sub-block): Vsg (waveform 606); Vsgd (unselected sub-block): float (waveform 604); Selected word lines: drive down to 0 V (waveform 614); and unselected word lines: float (waveform 616).

Vsgs is the source-side select gate voltage and Vsgd is the drain-side select gate voltage.

For example, Vsg can be about 5-15 V and Verase can be about 15-25 V. In the preparation phase, if Vsl is roughly equal to Vsgs, essentially no GIDL will be generated from the SGS transistor. Vsl would need to exceed Vsgs by a substantial margin such as several Volts, e.g., at least about 4-6 V, in order to generate GIDL from the SGS transistor. Similarly, since Vbl roughly equals Vsgd, essentially no GIDL will be generated from the SGD transistor. Vbl would need to exceed Vsgd by a substantial margin to generate GIDL from the SGD transistor.

Specifically, GIDL current at a select gate is determined by the bias difference ($V_{dg}=V_d-V_g$), between the drain voltage (Vd) and the gate voltage (Vg) of the select gate. The GIDL current density can be modeled by: $J=A*Es*exp(-B/Es)$, where Es is the transverse electric field at the surface, and $Es=(V_{dg}+C)/Tox$. Thus, $J=A'*(V_{dg}+C)*exp(-B'(V_{dg}+C))$, where A', B' and C are constants determined by some physical parameters. Normally, $V_{dg} \gg V_{th}$ of the select gate to obtain a considerable GIDL current. In one configuration, $V_{dg}>4-6$ V or 4-8 V is needed for erase pulse width of about 1 msec. When Vdg is small, GIDL is negligible and is not able to charge-up the inhibited channel to cause erase.

Vbody (waveform 608 in FIG. 6C) denotes a potential of the body of the selected NAND string, e.g., the polysilicon body. The body is quickly charged up to an initial level in the preparation phase. A higher level of GIDL is generated in the charge up phase, and the body is charged-up to a higher level. For an unselected NAND string, Vbody is not charged up as much and may be between about 0 V and the initial level for the selected NAND strings. It is difficult to describe the body potential of the entire body using a single value due to the floating of the word lines. The body can be thought of as an electron pool, such that when Vsg+1 V is applied on both the bit line and source line, and Vsg is applied to SGS and SGD select gates, electrons start to flow to the bit line and source line so that the body potential increases. However, the electrons are quickly exhausted as there is no more electron supply in the body, so that the body potential will not increase further. This is different from the body of the selected NAND strings in the charge-up stage, where GIDL-generated holes flood into the channel and raise the whole body potential.

Vth (waveform 612 in FIG. 6D) is the threshold voltage of a selected memory cell. It is at some non-zero level, e.g., above 0 V, perhaps 1-6 V, in the A, B or C state. Vwl-selected (waveform 614 in FIG. 6E) is the voltage of a selected word line (e.g., word line layer or portion) which is in communication with one or more selected memory cells to be erased. Vwl-unselected (waveform 616 in FIG. 6E) is the voltage of an unselected word line (e.g., word line layer or portion) which is in communication with one or more unselected memory cells, to be inhibited from being erased.

In the charge up phase, for the two-sided erase, Vsl and Vbl are stepped up to Verase from t3-t8 (waveform 600). As a result, Vdg (the drain-to-gate voltage of the SGD or SGS select gates) is increased high enough so that GIDL is generated at the SGS and SGD select gates, charging up the body (Vbody). Verase is considered to be an erase voltage—it is sufficiently higher than Vsg to cause a significant amount of GIDL to charge up the body by a desired amount in a desired amount of time. In practice, as mentioned, Verase can exceed Vsg by at least about 4-6 V and perhaps about 10-15 V. Verase can range from about 15-25 V, as mentioned.

Vbody can be of a similar magnitude as Verase, perhaps 0-2 V lower. The rise in Vbody is coupled to the floating word lines so that Vwl-selected and Vwl-unselected rise up with Vbody. Vwl-selected and Vwl-unselected can be of a similar magnitude as Vbody, perhaps slightly lower.

In the erase phase, Vwl-selected is driven to a low level such as 0 V at t6-t7 to add holes into the charge trapping layer, lowering the Vth of the selected memory cells, as indicated by waveform 612. Vwl-unselected continues to float so that holes are not added to the charge trapping layer for unselected memory cells.

Figure 5C:
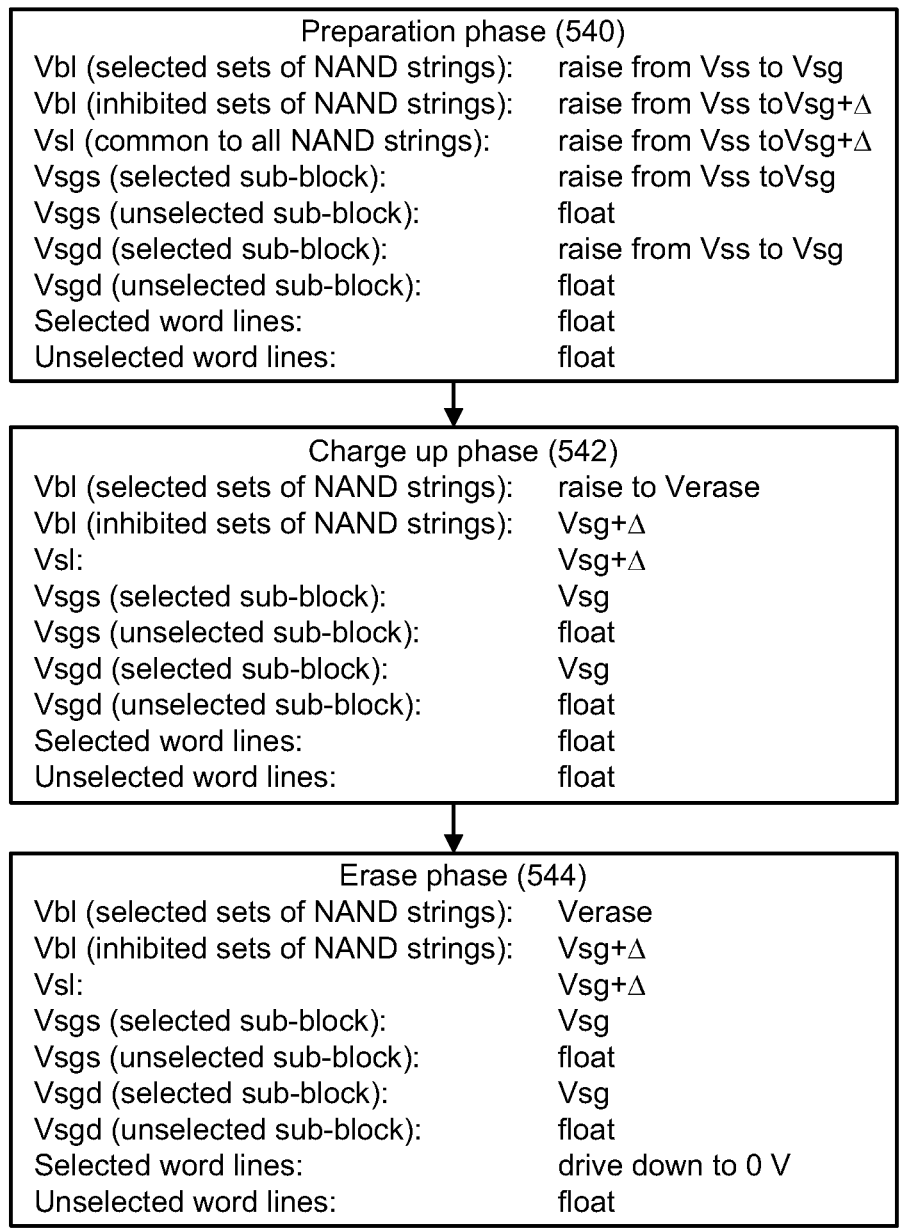
FIG. 5C depicts details of step 526 (one-sided erase) of FIG. 5A.

FIG. 5C depicts details of step 526 (one-sided erase) of FIG. 5A. At step 540, the preparation phase sets voltages as follows: Vbl (selected sets of NAND strings): raise from Vss to Vsg (waveform 600); Vbl (inhibited sets of NAND strings): Vsg+Δ (waveform 602); Vsl (common to all NAND strings): Vsg+Δ (waveform 602); Vsgs (selected sub-block): Vsg (waveform 606); Vsgs (unselected sub-block): float (waveform 604); Vsgd (selected sub-block): raise from Vss to Vsg (waveform 606); Vsgd (unselected sub-block): float (waveform 604); selected word lines: float (waveform 614); and unselected word lines: float (waveform 616).

At step 542, the charge up phase sets voltages as follows: Vbl (selected sets of NAND strings): raise to Verase (waveform 600); Vbl (inhibited sets of NAND strings): Vsg+Δ (waveform 602); Vsl: Vsg+Δ (waveform 602); Vsgs (selected sub-block): Vsg (waveform 606); Vsgs (unselected sub-block): float (waveform 604); Vsgd (selected sub-block): Vsg (waveform 606); Vsgd (unselected sub-block): float (waveform 604); selected word lines: float (waveform 614); and unselected word lines: float (waveform 616).

At step 544, the erase phase sets voltages as follows: Vbl (selected sets of NAND strings): Verase (waveform 600); Vbl (inhibited sets of NAND strings): Vsg+Δ (waveform 602); Vsl: Vsg+Δ (waveform 602); Vsgs (selected sub-block): Vsg (waveform 606); Vsgs (unselected sub-block): float (waveform 604); Vsgd (selected sub-block): Vsg (waveform 606); Vsgd (unselected sub-block): float (waveform 604); selected word lines: drive down to 0V (waveform 614); and unselected word lines: float (waveform 616).

During the one-sided erase, Vsl=Vsg+Δ, as indicated by waveform 602. Also, Vbl=Vsg+Δ (waveform 602) for the inhibited sets of NAND strings. Vbl=Vsg+Δ or some other low voltage is considered to be an erase-inhibit voltage—it is not sufficiently higher than Vsg to cause a significant amount of GIDL to charge up the body. By applying Vsg+Δ, where Δ (delta) is about 0-2 V, for both inhibited bit lines and source lines, various advantages are achieved. First, essentially no GIDL will be generated at both the inhibited bit line and source line sides on a NAND string. A better select gate cutoff is achieved. Second, for the inhibited NAND strings, Vsg+Δ is sufficiently high so that both SGD and SGS are cut off, so that leakage is minimized. Third, Vsg+Δ is sufficiently low to avoid causing any erase in the inhibited NAND strings. Other approaches are possible but may be less advantageous. For example, floating the source line and the SGS select gate while applying a lower voltage such as 0 V to an inhibited bit line can result in a direct leakage path from a selected bit line to the inhibited bit line.

Since the GIDL is generated only at the drain end of the selected NAND strings in the one-sided erase, Vbody may charge up slightly slower compared to when GIDL is generated at both the drain and source ends of the selected NAND strings, but this does not significantly impair the erase operation.

FIGS. 6A to 6E have a common time axis but the time increments are not necessarily equally spaced and the figures are not necessarily to scale.

Figure 7A:
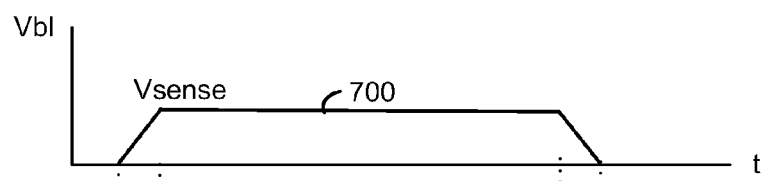
FIGS. 7A-7C depict voltages in the verify portion of an erase-verify iteration of an erase operation.
Figure 7B:
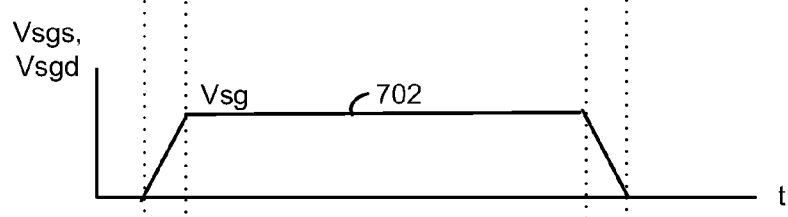
Figure 7C:
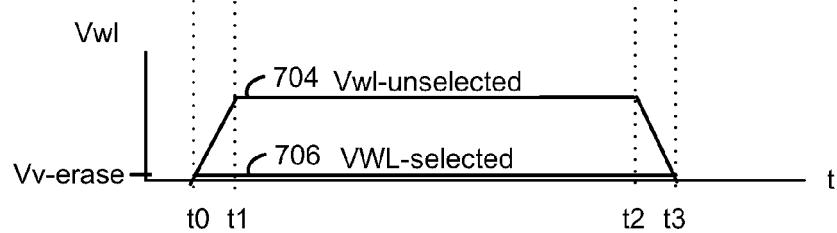

FIGS. 7A-7C depict voltages in the verify portion of an erase-verify iteration of an erase operation. During the verify portion, the selected sets of NAND strings are sensed using sensing circuitry to determine whether the threshold voltages of the selected memory cells have passed the erase-verify test. During the sensing, Vbl is set to a sense voltage, Vsense (waveform 700 in FIG. 7A). Vsgs and Vsgd (waveform 702 in FIG. 7B) are set to a level such as Vsg which renders them conductive. Vsgs and Vsgd can be set to the same or different levels. Vwl-unselected (waveform 704 in FIG. 7C) is set to a sufficiently high level, e.g., 8 V, to render the unselected memory cells in a conductive state. Vwl-selected (waveform 706 in FIG. 7C) is set to Vv-erase. Sensing circuitry connected to a NAND string senses whether the NAND string is in a conductive state, which indicates the selected memory cells of the NAND string have been erased and therefore pass the erase-verify test.

In one approach, the verify portion involves performing the erase-verify test for the selected NAND strings in one sub-block at a time. For example, in FIG. 2A, the NAND strings in sub-block 201 can be verified. Typically, each NAND string is verified separately from other NAND strings and the verifying occurs concurrently for the different NAND strings in a sub-block. Next, the NAND strings in sub-block 202 are verified. The NAND strings in each sub-block are verified until the NAND strings in sub-block 206 have been verified, at which time the block has been verified and the very portion of the erase-verify iteration has ended.

FIGS. 7A to 7C have a common time axis (different than the time axis of FIGS. 6A to 6E) but the time increments are not necessarily equally spaced and the figures are not necessarily to scale.

Figure 8A:
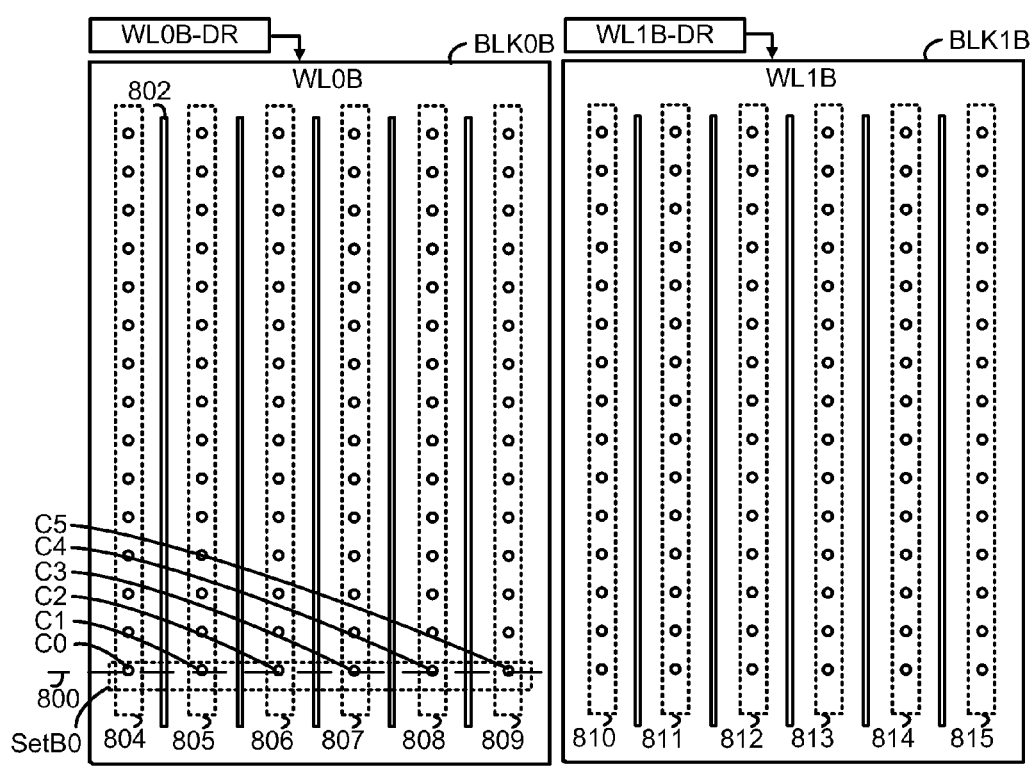
FIG. 8A depicts a top view of word line layers of a 3D non-volatile memory device having straight NAND strings, consistent with FIG. 1D, showing associated drivers.

FIG. 8A depicts a top view of word line layers of a 3D non-volatile memory device having straight NAND strings, consistent with FIG. 1D, showing associated drivers. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, BLK0B has word line layer WL0B, driven by WL0B-DR, and BLK1B has word line layer WL1B, driven by WLB1-DR. A number of slits, such as example slit 802, can also be used. These insulation-filled slits are used in the fabrication process to provide structural support for the stack when undoped polysilicon layers are removed by a wet etch and a dielectric is deposited to form the alternating dielectric layers.

Figure 8B:
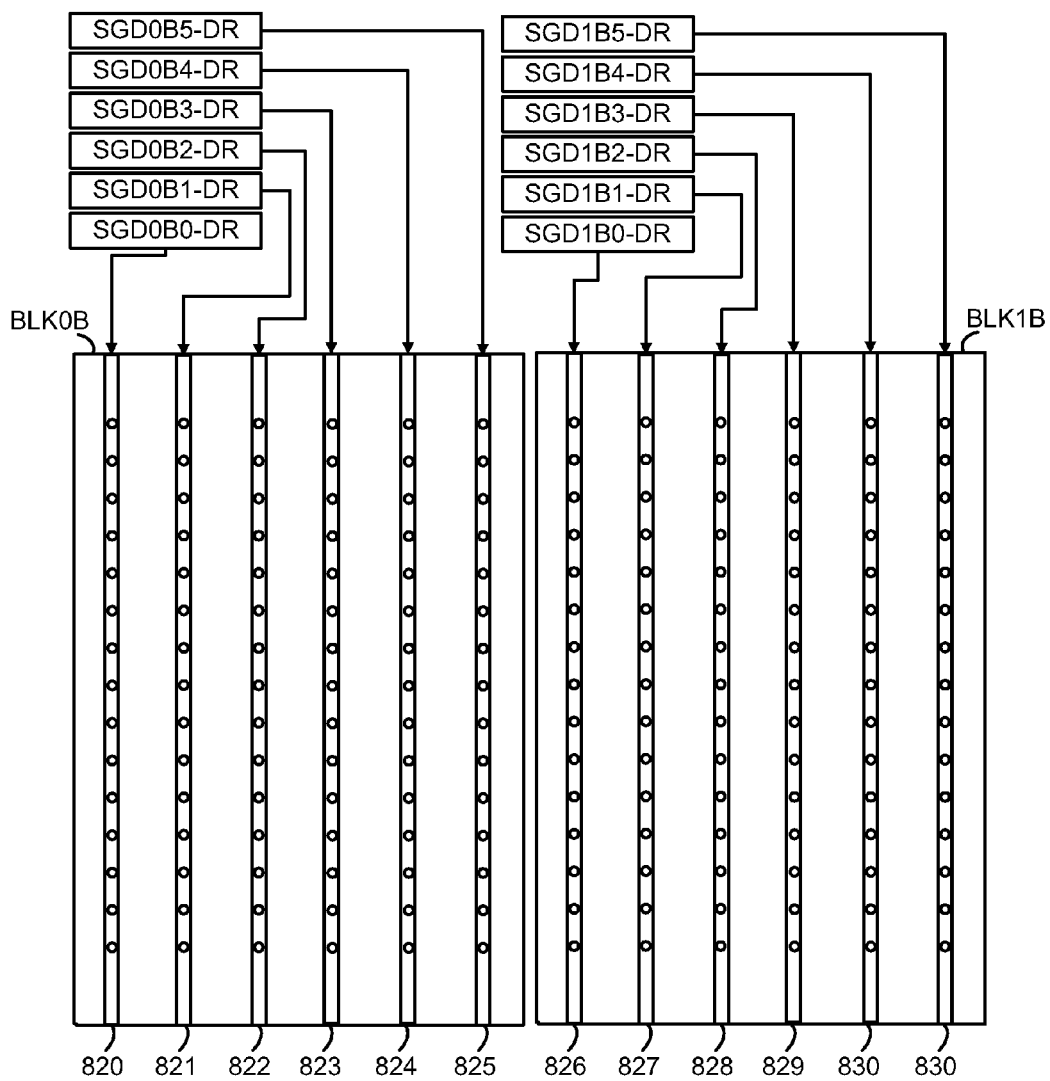
FIG. 8B depicts a top view of a select gate layer of the 3D non-volatile memory device of FIG. 8A, showing drain-side select gate lines and associated drivers.
Figure 8C:
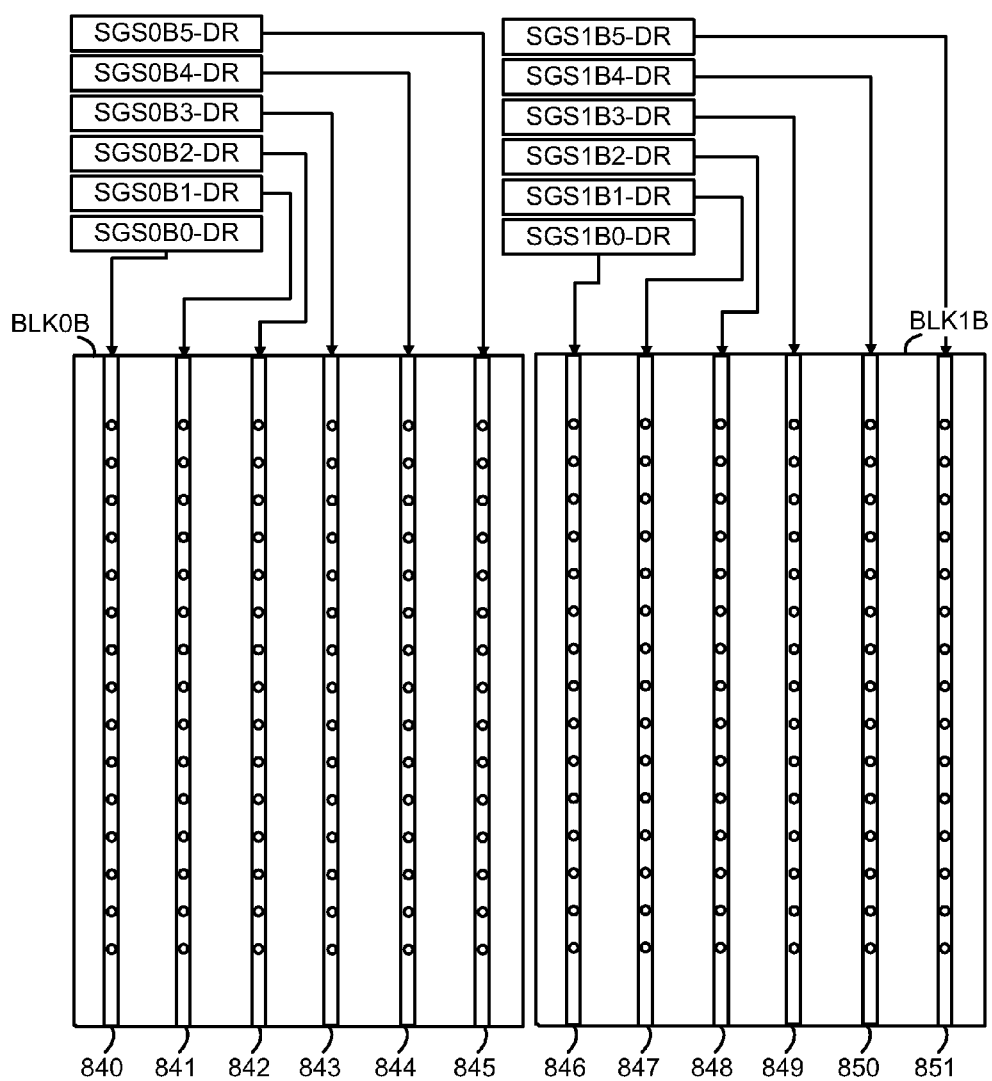
FIG. 8C depicts a top view of a select gate layer of the 3D non-volatile memory device of FIG. 8A, showing source-side select gate lines and associated drivers.
Figure 8D:
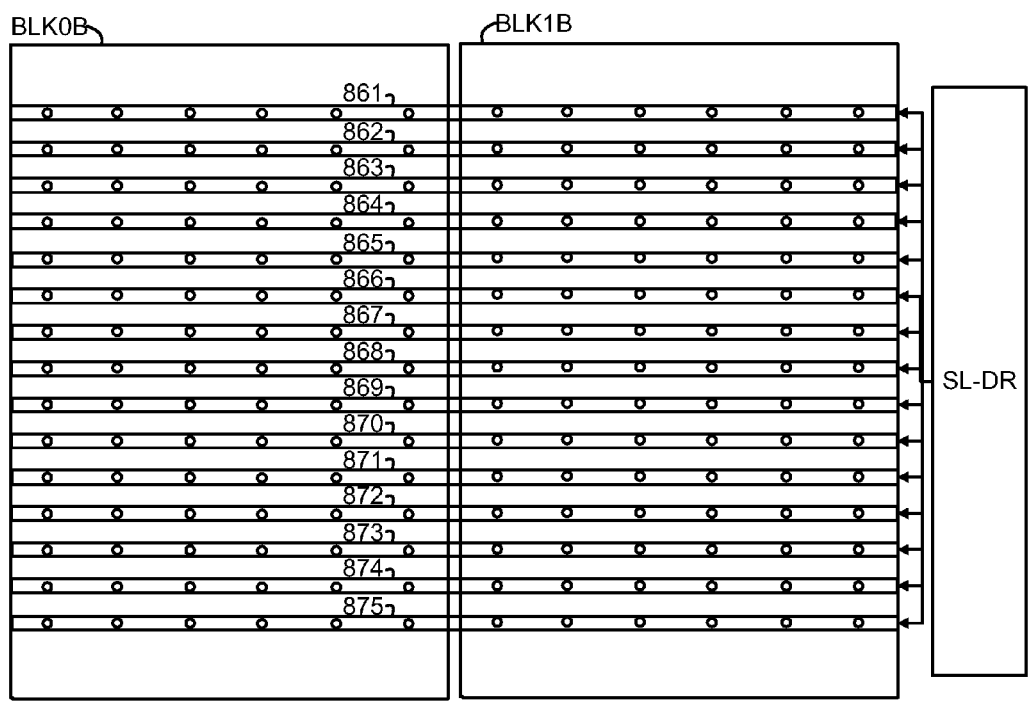
FIG. 8D depicts a top view of a source line layer of the 3D non-volatile memory device of FIG. 8A, showing source lines and associated drivers.
Figure 8E:
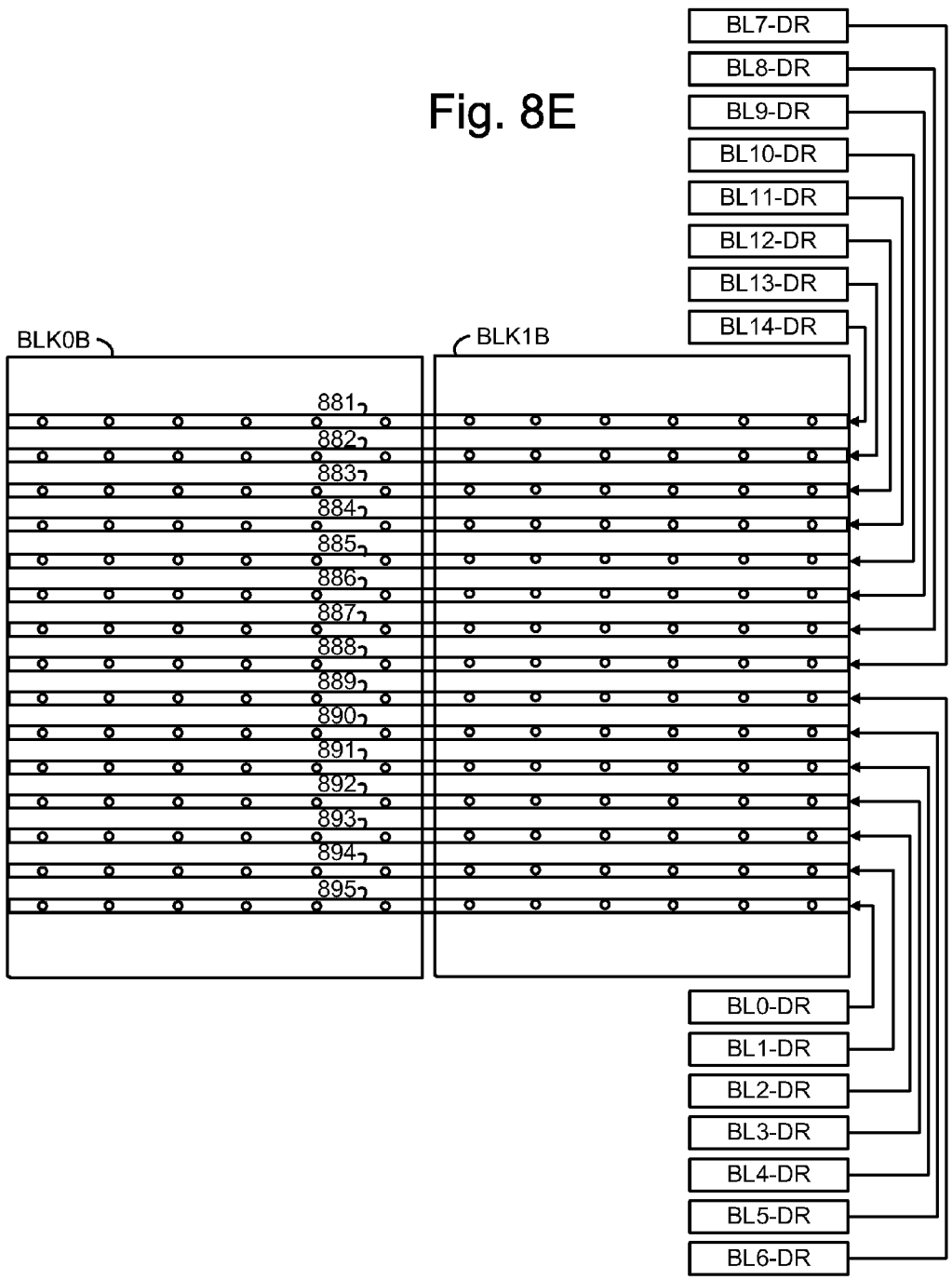
FIG. 8E depicts a top view of a bit line layer of the 3D non-volatile memory device of FIG. 8A, showing bit lines and associated drivers.
Figure 8F:
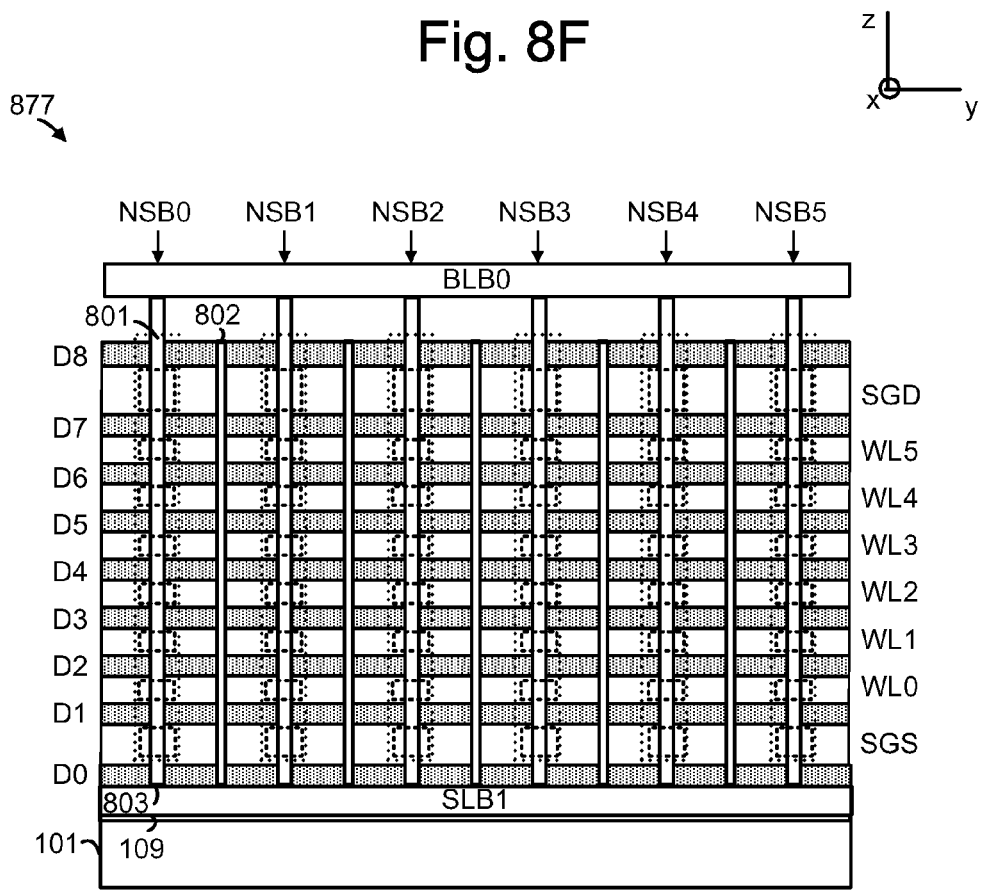
FIG. 8F depicts a cross-sectional view of a block of the 3D non-volatile memory device of FIG. 8A, along line 800 of setB0 of NAND strings FIG. 8A.

A dashed line 800 extends through columns C0 to C6, shown in cross-section in FIG. 8F. Each block can include sub-blocks of columns of memory cells, such as sub-blocks 804 to 809 in BLK0B and sub-blocks 810 to 815 in BLK1B.

FIG. 8B depicts a top view of a select gate layer of the 3D non-volatile memory device of FIG. 8A, showing drain-side select gate lines and associated drivers. For example, this can represent layer SGD of FIG. 8F. A separate drain-side select gate line, e.g., a conductive line or path, may be associated with each row of columns of memory cells. For example, BLK0B includes select gate lines 820 to 825, which are driven by select gate drivers SGD0-DR to SGD5-DR, respectively. BLK1B includes select gate lines 826 to 831, which are driven by select gate drivers SGD6-DR to SGD11-DR, respectively. The select gate drivers provide signals such as voltage waveforms to the select gate lines.

FIG. 8C depicts a top view of a select gate layer of the 3D non-volatile memory device of FIG. 8A, showing source-side select gate lines and associated drivers. For example, this can represent layer SGS of FIG. 8F. A separate source-side select gate line, e.g., a conductive line or path, is associated with each row of columns of memory cells. For example, BLK0B includes select gate lines 840 to 846, which are driven by select gate drivers SGS0B0-DR to SGS05B-DR, respectively. BLK1B includes select gate lines 846 to 851, which are driven by select gate drivers SGS1B0-DR to SGS1B5-DR, respectively. The select gate drivers provide signals such as voltage waveforms to the select gate lines.

FIG. 8D depicts a top view of a source line layer of the 3D non-volatile memory device of FIG. 8A, showing source lines and associated drivers. For example, this can represent layer SL of FIG. 8F. A source line, e.g., a conductive line or path, is associated with a set of columns of memory cells which extend in a horizontal line in the figure. A source line extends across multiple blocks which are adjacent laterally of one another. A source line is connected to a source-side end of a NAND string, e.g., to a vertical channel or body of the NAND string. For example, source lines 861 to 875 are driven by source line driver SL-DR. The source line driver provides a signal such as a voltage waveform to the source-side ends of the NAND strings.

FIG. 8E depicts a top view of a bit line layer of the 3D non-volatile memory device of FIG. 8A, showing bit lines and associated drivers for BLK0B and BLK1B. For example, this can represent layer BL of FIG. 8F. A bit line, e.g., a conductive line or path, is associated with a set of columns of memory cells which extend in a horizontal line in the figure. A bit line extends across multiple blocks which are adjacent laterally of one another. A bit line is connected to a drain-side end of a NAND string, e.g., to a vertical channel or body of the NAND string. For example, bit lines 881 to 895 are driven by bit line drivers BL0-DR to BL14-DR, respectively. The bit line drivers provide signals such as voltage waveforms to the drain-side ends of the NAND strings.

FIG. 8F depicts a cross-sectional view of a block of the 3D non-volatile memory device of FIG. 8A, along line 800 of setB0 of NAND strings FIG. 8A. Columns of memory cells corresponding to NAND strings NSB0 to NSB5, respectively, are depicted in the multi-layer stack. The stack 877 includes a substrate 101, an insulating film 109 on the substrate, and a portion of a source line 863. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 803 and a drain end 801. The slit 802 from FIG. 8A is also depicted with other slits. A portion of the bit line BLB0 is also depicted. Dashed lines depict memory cells and select gates, as discussed further below.

Figure 9:
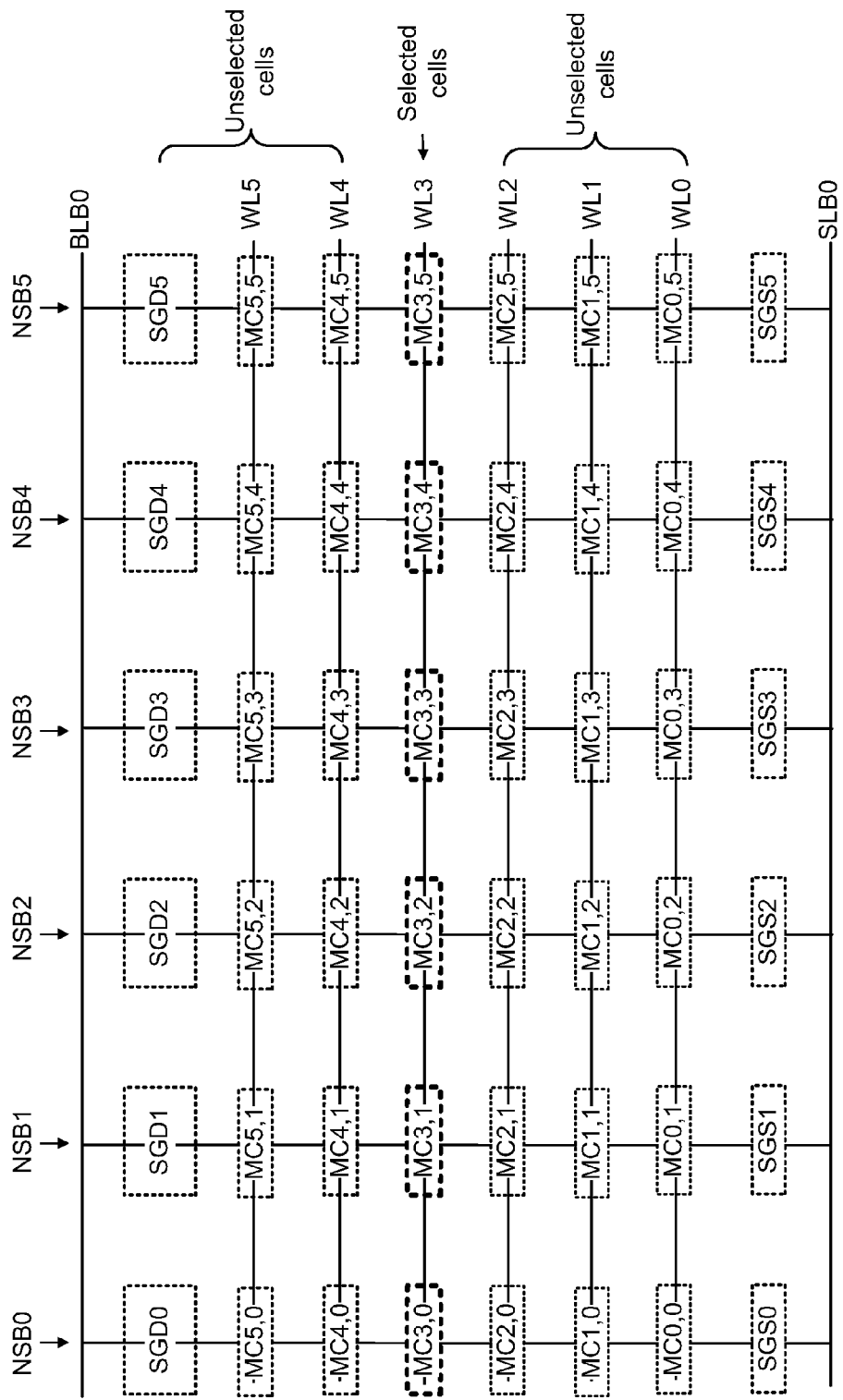
FIG. 9 depicts an arrangement of memory cells in an example set of NAND strings such as SetB0 in FIG. 8F.

FIG. 9 depicts an arrangement of memory cells in an example set of NAND strings such as SetB0 in FIG. 8F. NAND strings NSB0 to NSB5 are depicted. A similar notation as used above is provided. In this erase process, all of the memory cells of WL3 (namely MC3,0 to MC3,5) are selected to be erased. The memory cells of WL0-WL2, WL4 and WL4 are unselected.

Accordingly, it can be seen that, in one embodiment, a 3D stacked non-volatile memory device includes: (1) a substrate; (2) a stacked non-volatile memory cell array carried by the substrate, and comprising a plurality of sets of memory strings, and each memory string comprises a plurality of memory cells between a drain end of the memory string and a source end of the memory string; (3) a plurality of bit lines, where, for each set of memory strings, a respective bit line of the plurality of bit lines is connected to the drain end of each memory string in the set of memory strings; (4) at least one source line connected to the source end of at least one memory string in each of the sets of memory strings; and (5) at least one control circuit in communication with the stacked non-volatile memory cell array, the plurality of bit lines and the plurality of source lines, the at least one control circuit: (a) to perform one erase-verify iteration in an erase operation for the plurality of sets of memory strings: applies an erase voltage to each bit line of the plurality of bit lines, then determines whether at least one of the sets of memory strings reaches a set erase-verify condition, the at least one of the sets of memory strings is connected to at least one of the bit lines, and (b) to perform a next erase-verify iteration in the erase operation: (i) if the at least one of the sets of memory strings reaches the set erase-verify condition, applies an erase voltage to remaining bit lines of the plurality of bit lines, other than the at least one of the bit lines, and applies an erase-inhibit voltage to the at least one of the bit lines, and (ii) if the at least one of the sets of memory strings does not reach the set erase-verify condition, applies an erase voltage to each bit line of the plurality of bit lines.

In another embodiment, a method for performing an erase operation in a 3D stacked non-volatile memory device comprises: (1) performing at least one erase-verify iteration of the erase operation for a stacked non-volatile memory cell array, the stacked non-volatile memory cell array comprising a plurality of sets of memory strings, and each memory string comprises a plurality of memory cells between a drain end of the memory string and a source end of the memory string, the drain ends of the memory strings of each set of memory strings are connected to a respective bit line of a plurality of bit lines, and the source ends of the memory strings are connected to at least one source line, each erase-verify iteration of the at least one erase-verify operation charges up a body of each of the memory strings from at least the drain ends; (2) determining whether at least one of the sets of memory strings connected to at least one of the bit lines reaches a set erase-verify condition; and (3) performing a next erase-verify iteration of the erase operation, (a) if the at least one of the sets of memory strings reaches the set erase-verify condition, the next erase-verify iteration of the erase operation charges up a body of each memory string connected to remaining bit lines of the plurality of bit lines other than the at least one of the bit lines, from the drain ends of each memory string connected to the remaining bit lines, and does not charge up a body of each memory string connected to the at least one of the bit lines, and (b) if the at least one of the sets of memory strings does not reach the set erase-verify condition, the next erase-verify iteration of the erase operation charges up the body of each of the memory strings from at least the drain ends.

In another embodiment, a 3D stacked non-volatile memory device includes: (1) a substrate; (2) a stacked non-volatile memory cell array carried by the substrate, and comprising a plurality of sets of memory strings, each memory string comprises a plurality of memory cells between a drain end of the memory string and a source end of the memory string, a drain-side select gate at the drain end of the memory string and a source-side select gate at the source end of the memory string; (3) a plurality of bit lines, where, for each set of memory strings, a respective bit line of the plurality of bit lines is connected to the drain end of each memory string in the set of memory strings; (4) at least one source line connected to the source end of at least one memory string in each of the sets of memory strings; and (5) at least one control circuit in communication with the stacked non-volatile memory cell array, the plurality of bit lines and the plurality of source lines, the at least one control circuit: (a) to perform one erase-verify iteration in an erase operation for the plurality of sets of memory strings: applies an erase voltage to each bit line of the plurality of bit lines, applies an erase voltage to the at least one source line, then determines whether at least one of the sets of memory strings reaches a set erase-verify condition, the at least one of the sets of memory strings is connected to at least one of the bit lines, and (b) to perform a next erase-verify iteration in the erase operation: (i) if the at least one of the sets of memory strings reaches the set erase-verify condition, applies an erase voltage to remaining bit lines of the plurality of bit lines, other than the at least one of the bit lines, applies a bit line erase-inhibit voltage to the at least one of the bit lines and applies a source line erase-inhibit voltage to the at least one source line, and (ii) if the at least one of the sets of memory strings does not reach the set erase-verify condition, applies an erase voltage to each bit line of the plurality of bit lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A 3D stacked non-volatile memory device, comprising:
a substrate;
a stacked non-volatile memory cell array carried by the substrate, and comprising a plurality of sets of memory strings, and each memory string comprises a plurality of memory cells between a drain end of the memory string and a source end of the memory string;
a plurality of bit lines, where, for each set of memory strings, a respective bit line of the plurality of bit lines is connected to the drain end of each memory string in the set of memory strings;
at least one source line connected to the source end of at least one memory string in each of the sets of memory strings; and
at least one control circuit in communication with the stacked non-volatile memory cell array, the plurality of bit lines and the at least one source line, the at least one control circuit: (a) to perform one erase-verify iteration in an erase operation for the plurality of sets of memory strings: applies an erase voltage to each bit line of the plurality of bit lines, then determines whether at least one of the sets of memory strings reaches a set erase-verify condition, the at least one of the sets of memory strings is connected to at least one of the bit lines, and (b) to perform a next erase-verify iteration in the erase operation: (i) if the at least one of the sets of memory strings reaches the set erase-verify condition, applies an erase voltage to remaining bit lines of the plurality of bit lines, other than the at least one of the bit lines, and applies an erase-inhibit voltage to the at least one of the bit lines, and (ii) if the at least one of the sets of memory strings does not reach the set erase-verify condition, applies an erase voltage to each bit line of the plurality of bit lines.

2. The 3D stacked non-volatile memory device of claim 1, wherein:
the erase voltage comprises an initial lower level (Vsg) and a subsequent peak level (Verase0 to Verase7); and
the erase-inhibit voltage exceeds the initial lower level by a margin ($\Delta$) of 0-2 V.

3. The 3D stacked non-volatile memory device of claim 1, wherein:
the plurality of sets of memory strings are in a block; and
the at least one control circuit ends the erase operation when the block meets a block erase-verify condition, the block erase-verify condition is met when no more than a specified number of the memory strings have not passed an erase-verify test.

4. The 3D stacked non-volatile memory device of claim 1, wherein:
the at least one of the sets of memory strings reaches the set erase-verify condition when the at least one control circuit determines that at least one memory string in the one of the sets of memory strings passes an erase-verify test.

5. The 3D stacked non-volatile memory device of claim 1, wherein:
the bit lines extend parallel to one another and the at least one source line extends transversely to the bit lines.

6. The 3D stacked non-volatile memory device of claim 1, wherein:
each memory string comprises a U-shaped NAND string; and
the at least one source line is connected to the source ends of two adjacent memory strings in each of the sets of memory strings.

7. The 3D stacked non-volatile memory device of claim 1, wherein:
each set of memory strings comprises a plurality of U-shaped NAND strings; and
for each set of memory strings, the respective bit line of the plurality of bit lines is connected to a drain end of each U-shaped NAND string.

8. The 3D stacked non-volatile memory device of claim 1, wherein:
each memory string comprises a U-shaped NAND string; and
each U-shaped NAND string comprises a source-side column of memory cells and a drain-side column of memory cells.

9. The 3D stacked non-volatile memory device of claim 1, wherein:
when the erase voltage is applied to each bit line of the plurality of bit lines, the at least one control circuit, to erase one or more memory cells in each set of memory strings, floats a control gate voltage of the one or more memory cells then drives the control gate voltage down to a lower fixed level.

10. The 3D stacked non-volatile memory device of claim 1, wherein:
each memory string comprises a drain-side select gate at the drain end of the memory string and a source-side select gate at the source end of the memory string;
during the one erase-verify iteration, the at least one control circuit applies an erase voltage to the at least one source line; and
during the next erase-verify iteration, if the at least one of the sets of memory strings reaches the set erase-verify condition, the at least one control circuit drives a voltage (Vsg) of each of the source-side select gates and applies an erase-inhibit voltage to the at least one source line.

11. A method for performing an erase operation in a 3D stacked non-volatile memory device, comprising:
performing at least one erase-verify iteration of the erase operation for a stacked non-volatile memory cell array, the stacked non-volatile memory cell array comprising a plurality of sets of memory strings, and each memory string comprises a plurality of memory cells between a drain end of the memory string and a source end of the memory string, the drain ends of the memory strings of each set of memory strings are connected to a respective bit line of a plurality of bit lines, and the source ends of the memory strings are connected to at least one source line, each erase-verify iteration of the at least one erase-verify iteration charges up a body of each of the memory strings from at least the drain ends;
determining whether at least one of the sets of memory strings connected to at least one of the bit lines reaches a set erase-verify condition; and
performing a next erase-verify iteration of the erase operation, (a) if the at least one of the sets of memory strings reaches the set erase-verify condition, the next erase-verify iteration of the erase operation charges up a body of each memory string connected to remaining bit lines of the plurality of bit lines other than the at least one of the bit lines, from the drain ends of each memory string connected to the remaining bit lines, and does not charge up a body of each memory string connected to the at least one of the bit lines, and (b) if the at least one of the sets of memory strings does not reach the set erase-verify condition, the next erase-verify iteration of the erase operation charges up the body of each of the memory strings from at least the drain ends.

12. The method of claim 11, wherein:
the determining comprises determining that each memory string in the one of the sets of memory strings passes an erase-verify test.

13. The method of claim 11, wherein:
each erase-verify iteration of the at least one erase-verify iteration charges up the body of each of the memory strings by applying an erase voltage to the drain ends of each of the memory strings; and
if the at least one of the sets of memory strings reaches the set erase-verify condition, the next erase-verify iteration: (c) charges up the body of each memory string connected to the remaining bit lines by applying an erase voltage to the drain ends of each memory string connected to the remaining bit lines, and (d) applies an erase-inhibit voltage to the drain ends of each memory string connected to the at least one of the bit lines, and drives (Vsg) a source-side select gate at the source end of each of the memory strings connected to the at least one of the bit lines.

14. The method of claim 11, wherein:
the erase operation erases one or more memory cells in each set of memory strings; and
a control gate voltage of the one or more memory cells is floated and then driven down to a lower fixed level (~0 V) in each of the at least one erase-verify iteration and the next erase-verify iteration.

15. The method of claim 11, wherein:
if the at least one of the sets of memory strings reaches the set erase-verify condition, the performing the next erase-verify iteration comprises floating source-side select gates at the source end of each of the memory strings connected to the at least one of the bit lines, so that each of the memory strings connected to the at least one of the bit lines is not subject to erase.

16. The method of claim 11, wherein:
each erase-verify iteration of the at least one erase-verify iteration charges up the body of each of the memory strings from the source ends, so that each of the memory strings is subjected to a two-sided erase; and
if the at least one of the sets of memory strings reaches the set erase-verify condition, the next erase-verify iteration does not charge up the body of each memory string connected to the remaining bit lines, so that each memory string connected to the remaining bit lines is subjected to a one-sided erase.

17. The method of claim 11, wherein:
the bit lines extend parallel to one another and the at least one source line extends transversely to the bit lines;
each memory string comprises a U-shaped NAND string; and
the at least one source line is connected to the source ends of two adjacent memory strings in each of the sets of memory strings.

18. The method of claim 11, wherein:
each set of memory strings comprises a plurality of U-shaped NAND strings; and
for each set of memory strings, the respective bit line of the plurality of bit lines is connected to a drain end of each U-shaped NAND string.

19. A 3D stacked non-volatile memory device, comprising:
a substrate;
a stacked non-volatile memory cell array carried by the substrate, and comprising a plurality of sets of memory strings, each memory string comprises a plurality of memory cells between a drain end of the memory string and a source end of the memory string, a drain-side select gate at the drain end of the memory string and a source-side select gate at the source end of the memory string;
a plurality of bit lines, where, for each set of memory strings, a respective bit line of the plurality of bit lines is connected to the drain end of each memory string in the set of memory strings;
at least one source line connected to the source end of at least one memory string in each of the sets of memory strings; and
at least one control circuit in communication with the stacked non-volatile memory cell array, the plurality of bit lines and the at least one source line, the at least one control circuit: (a) to perform one erase-verify iteration in an erase operation for the plurality of sets of memory strings: applies an erase voltage to each bit line of the plurality of bit lines, applies an erase voltage to the at least one source line, then determines whether at least one of the sets of memory strings reaches a set erase-verify condition, the at least one of the sets of memory strings is connected to at least one of the bit lines, and (b) to perform a next erase-verify iteration in the erase operation: (i) if the at least one of the sets of memory strings reaches the set erase-verify condition, applies an erase voltage to remaining bit lines of the plurality of bit lines, other than the at least one of the bit lines, applies a bit line erase-inhibit voltage to the at least one of the bit lines and applies a source line erase-inhibit voltage to the at least one source line, and (ii) if the at least one of the sets of memory strings does not reach the set erase-verify condition, applies an erase voltage to each bit line of the plurality of bit lines.

20. The 3D stacked non-volatile memory device of claim 19, wherein:
the bit lines extend parallel to one another; and
the at least one source line extends transversely to the bit lines.

21. The 3D stacked non-volatile memory device of claim 19, wherein:
each memory string comprises a U-shaped NAND string; and
the at least one source line is connected to the source ends of two adjacent memory strings in each of the sets of memory strings.

22. The 3D stacked non-volatile memory device of claim 19, wherein:
during the next erase-verify iteration, if the at least one of the sets of memory strings reaches the set erase-verify condition, the at least one control circuit floats a voltage of each of the source-side select gates and applies an erase-inhibit voltage to the at least one source line.

* * * * *